US011682975B2

(12) United States Patent
Ishimatsu et al.

(10) Patent No.: US 11,682,975 B2
(45) Date of Patent: Jun. 20, 2023

(54) POWER CONVERSION DEVICE

(71) Applicant: ROHM CO., LTD., Kyoto (JP)

(72) Inventors: Yuji Ishimatsu, Kyoto (JP); Ryuichi Furutani, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/869,536

(22) Filed: Jul. 20, 2022

(65) Prior Publication Data
US 2022/0360179 A1    Nov. 10, 2022

Related U.S. Application Data

(63) Continuation of application No. 17/284,229, filed as application No. PCT/JP2019/042090 on Oct. 28, 2019, now Pat. No. 11,451,153.

(30) Foreign Application Priority Data

Nov. 8, 2018  (JP) ................................. 2018-210591

(51) Int. Cl.
*H02M 7/537* (2006.01)
*H02M 3/335* (2006.01)
(Continued)

(52) U.S. Cl.
CPC ....... *H02M 3/33507* (2013.01); *H02M 1/081* (2013.01); *H02M 1/327* (2021.05); *H02M 7/003* (2013.01); *H02M 7/537* (2013.01)

(58) Field of Classification Search
CPC .. H02M 3/33507; H02M 1/327; H02M 1/081; H02M 7/003; H02M 7/537
See application file for complete search history.

(56) References Cited

U.S. PATENT DOCUMENTS 11,398,818 B2 *  7/2022  Ishimatsu ............ H03K 17/165
11,451,153 B2 *  9/2022  Ishimatsu ............ H02M 7/537
(Continued)

FOREIGN PATENT DOCUMENTS

JP      2006-121834 A    5/2006
JP      2010-263671 A   11/2010
(Continued)

OTHER PUBLICATIONS

International Search Report issued in PCT/JP2019/042090, dated Dec. 17, 2019 (2 pages).
(Continued)

*Primary Examiner* — Adolf D Berhane
(74) *Attorney, Agent, or Firm* — Hamre, Schumann, Mueller & Larson, P.C.

(57) ABSTRACT

The power converter A1 includes a semiconductor device B1, and a substrate H on which the semiconductor device B1 is mounted, where the semiconductor device B1 includes a control chip constituting a primary control circuit, a semiconductor chip constituting a secondary power circuit, and a transmission circuit for electrically insulating the primary control circuit and the secondary power circuit and for signal transmission between the primary control circuit and the secondary power circuit. The substrate H has a conductive portion K. The power converter A1 includes a connecting terminal T1 disposed on the substrate H and electrically connected to the conductive portion K. The power converter A1 includes a conductive path D1 that is at least partially formed by the conductive portion K of the substrate H, and that electrically connects the primary control circuit and the connecting terminal T1. Such a configuration contributes to downsizing the power converter A1.

20 Claims, 15 Drawing Sheets

(51) Int. Cl.
*H02M 1/32* (2007.01)
*H02M 1/08* (2006.01)
*H02M 7/00* (2006.01)

(56) References Cited

U.S. PATENT DOCUMENTS

| | | |
|---|---|---|
| 2010/0059875 A1 | 3/2010 | Sato et al. |
| 2019/0305689 A1 | 10/2019 | Ando |
| 2022/0020730 A1 | 1/2022 | Katoh |
| 2022/0108936 A1 | 4/2022 | Yoshimi et al. |
| 2022/0108945 A1 | 4/2022 | Yuferev et al. |

FOREIGN PATENT DOCUMENTS

| | | |
|---|---|---|
| JP | 2011-4603 A | 1/2011 |
| JP | 2014-165956 A | 9/2014 |
| JP | 2017-28058 A | 2/2017 |
| WO | 2018/003827 A1 | 1/2018 |

OTHER PUBLICATIONS

Office Action received in the corresponding Japanese Patent application, dated Apr. 25, 2023, and machine translation (10 pages).

\* cited by examiner

FIG.7
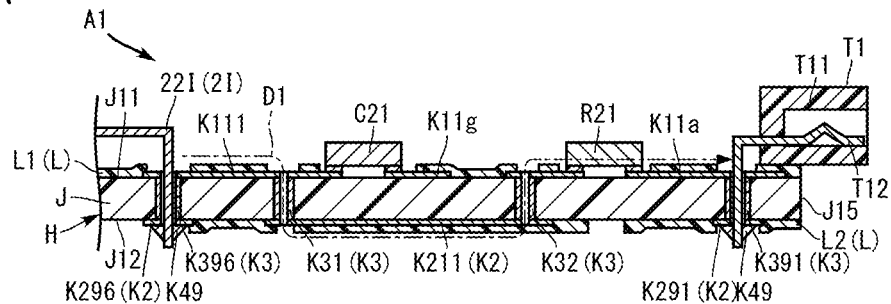
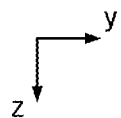
FIG.8
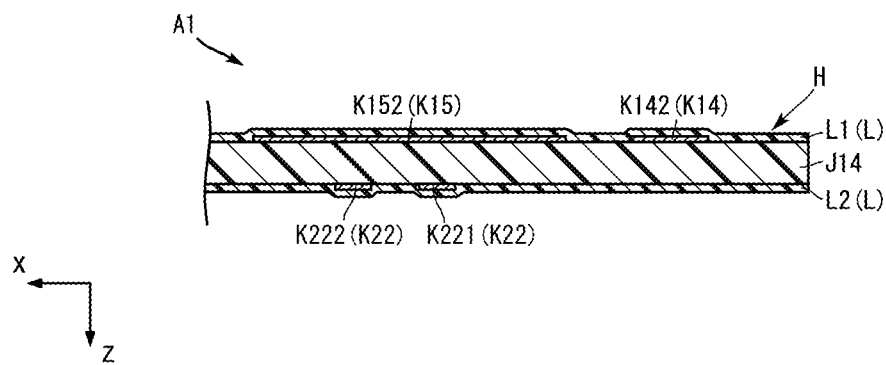
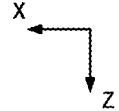
FIG.9
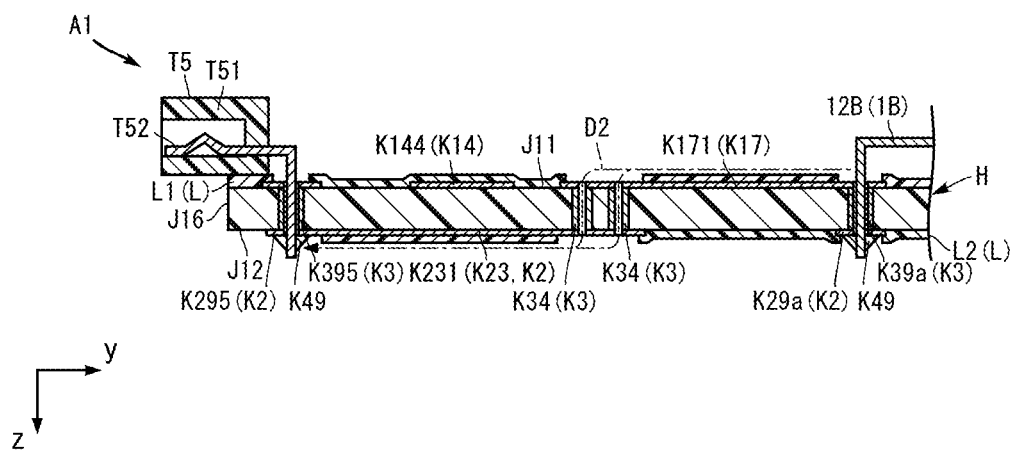
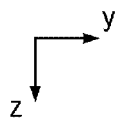

POWER CONVERSION DEVICE

TECHNICAL FIELD

The Present disclosure relates to a power converter.

BACKGROUND ART

Power converters disclosed so far (see Patent Document 1, for example) may be configured to supply power to e.g., a three-phase AC motor based on conversion to AC power from DC power available from a DC power supply. A power converter may output required power from a secondary power circuit based on primary control signals. Such a power converter uses an insulating circuit for electrically isolating the primary control circuit and the secondary power circuit. For the insulating circuit, use may be made of a photocoupler.

TECHNICAL REFERENCE

Patent Document

Patent Document 1: Japanese Patent Application Publication No. 2014-165956

SUMMARY OF THE INVENTION

Problems to be Solved by the Invention

The insulating circuit may be mounted on a constituting component, such as a substrate, of the power converter. Installation of the insulating circuit, however, hinders the downsizing of the power converter.

In light of the foregoing, an object of the present disclosure is to provide a power converter that can be downsized.

Means for Solving the Problems

In accordance with the present disclosure, there is provided a power converter that may be provided with: a semiconductor device that includes a control chip constituting a primary control circuit, a semiconductor chip constituting a secondary power circuit, and a transmission circuit electrically insulating the primary control circuit and the secondary power circuit and having a signal transmission function between the primary control circuit and the secondary power circuit; a first substrate with the semiconductor device mounted thereon, where the substrate is formed with a first conductive portion; a first connecting terminal disposed on the first substrate and electrically connected to the first conductive portion; and a first conductive path at least a portion of which is formed by the first conductive portion of the first substrate, where the first conductive path electrically connects the primary control circuit and the first connecting terminal.

Effect of the Invention

The power converter of the present disclosure allows for downsizing.

Other features and advantages of the present disclosure will become apparent from the detailed description given below with reference to the accompanying drawings.

BRIEF DESCRIPTION OF THE DRAWINGS

FIG. 7 is a main-part enlarged cross-sectional view along line VII-VII of FIG. 4;

FIG. 8 is a main-part enlarged cross-sectional view along line VIII-VIII of FIG. 4;

FIG. 9 is a main-part enlarged cross-sectional view along line IX-IX of FIG. 5;

MODE FOR CARRYING OUT THE INVENTION

The following specifically describes a preferred embodiment of the present disclosure with reference to the attached drawings.

Terms such as "first", "second", and "third" in the present disclosure are merely used as labels, and do not necessarily imply the sequence or order of the elements provided with the terms.

First Embodiment

FIGS. 1 to 9 show a power converter A1 according to a first embodiment of the present disclosure. The power converter A1 according to the present embodiment includes a semiconductor device B1, a substrate H, connecting terminals T1, T2, T3, T4, and T5, a plurality of resistors R, and a plurality of capacitors C. The power converter A1 converts, for example, DC power from a power supply E3, which is the source of power, to three-phase AC power for driving a motor M1. Note that the application and function of the power converter of the present disclosure are not limited to the above.

Figure 1:
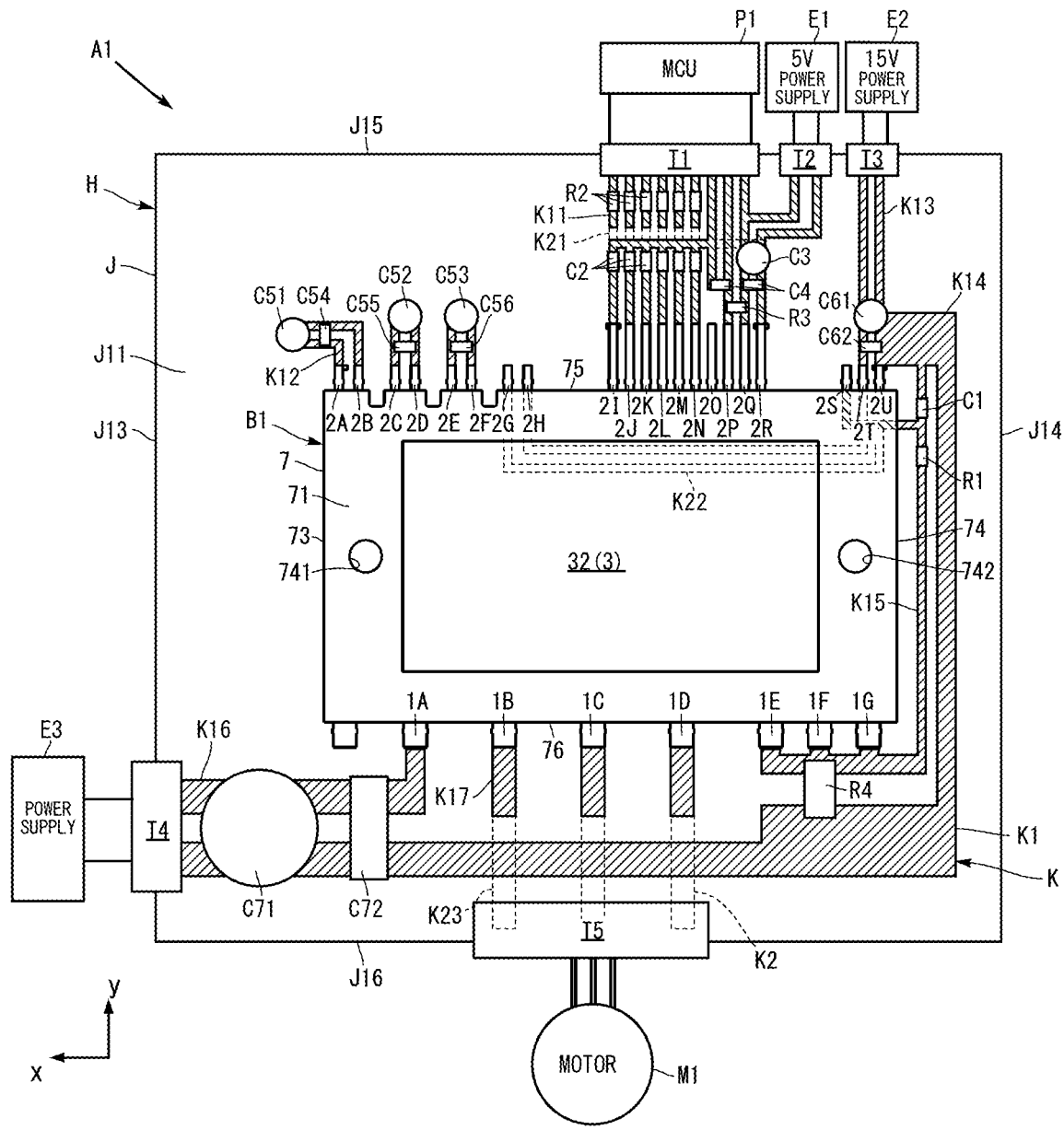
FIG. 1 is a plan view showing a power converter according to a first embodiment of the present disclosure.
Figure 2:
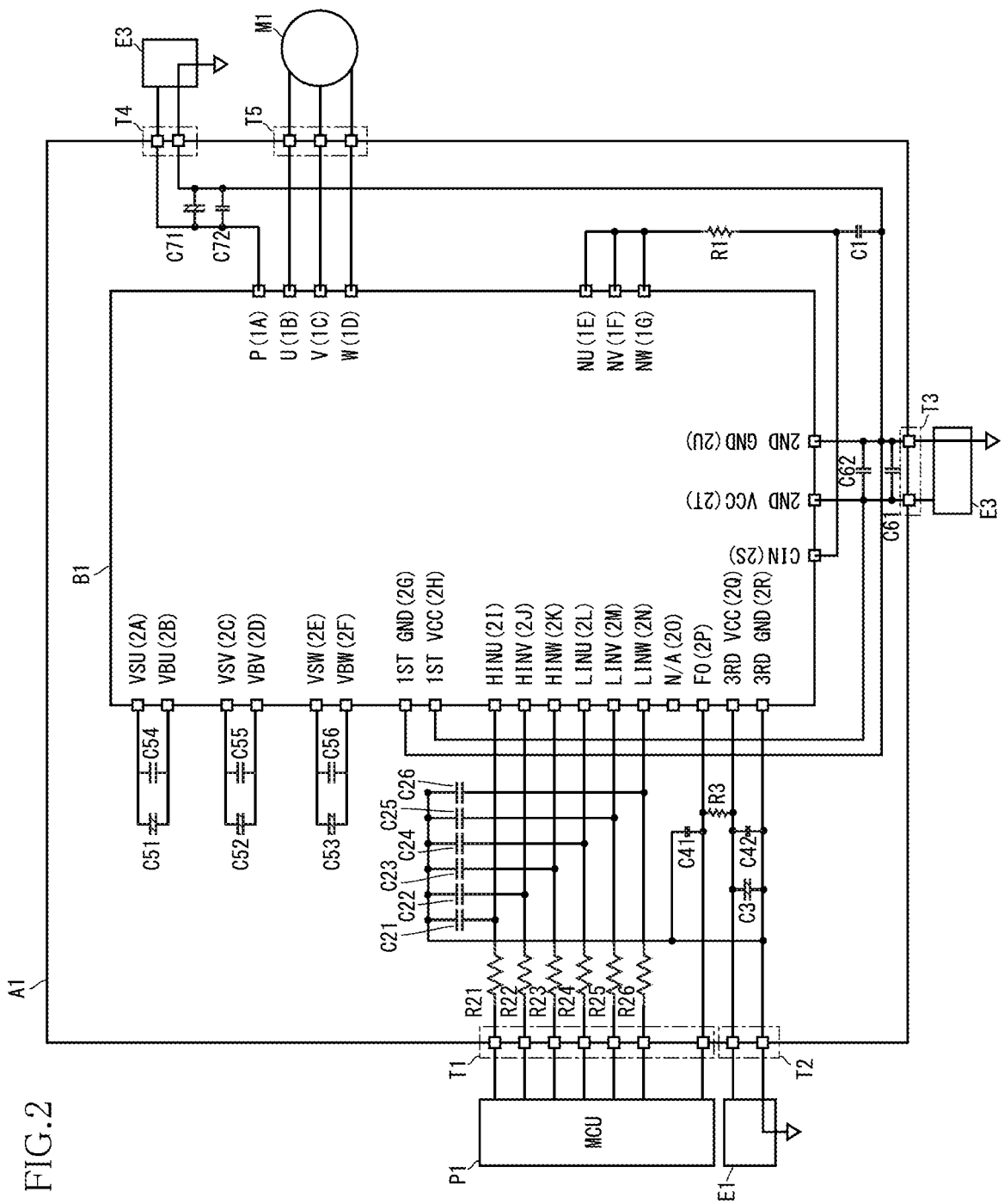
FIG. 2 is a system configuration diagram showing the power converter according to the first embodiment of the present disclosure.
Figure 3:
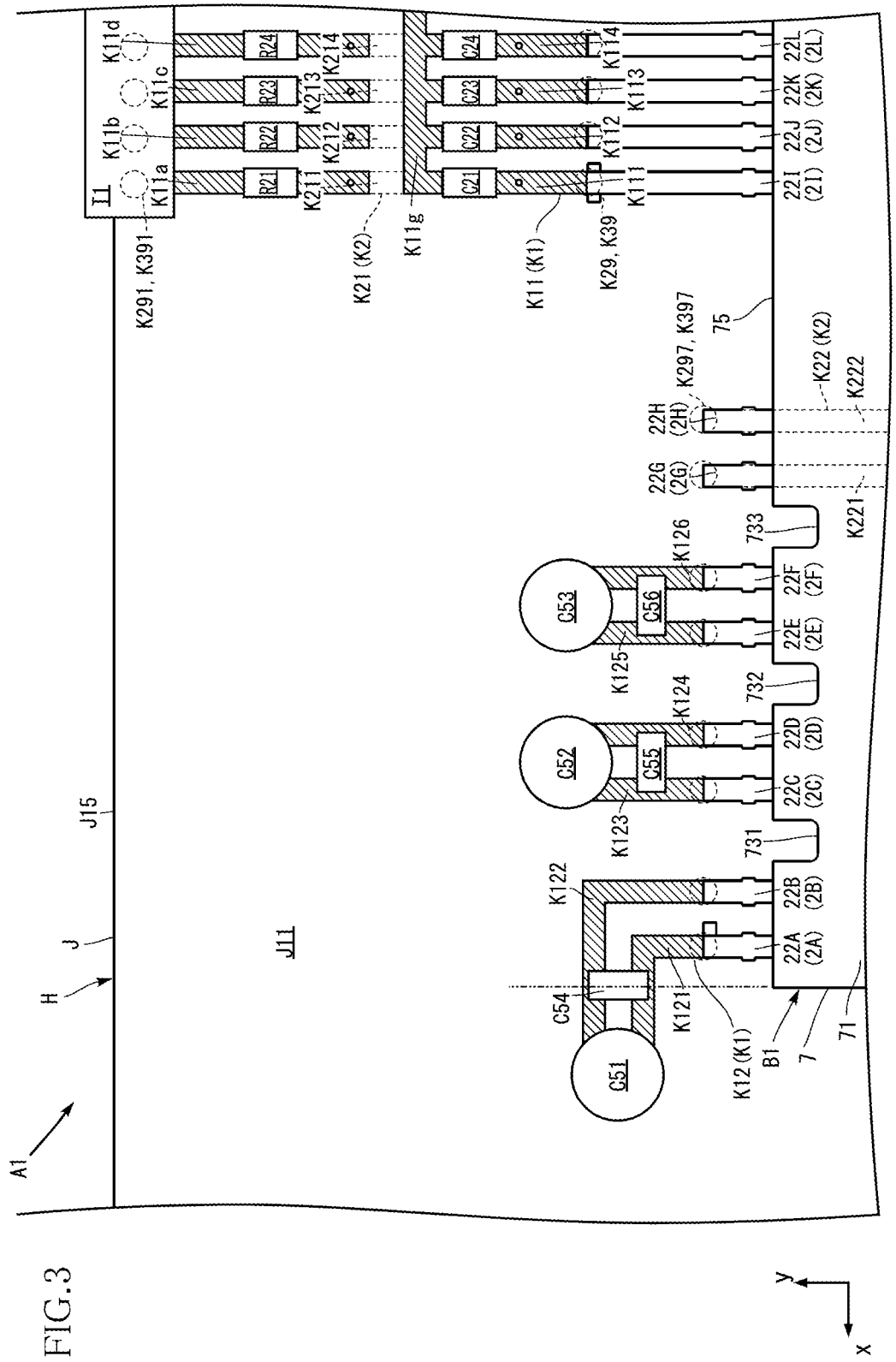
FIG. 3 is a main-part enlarged plan view showing the power converter according to the first embodiment of the present disclosure.
Figure 4:
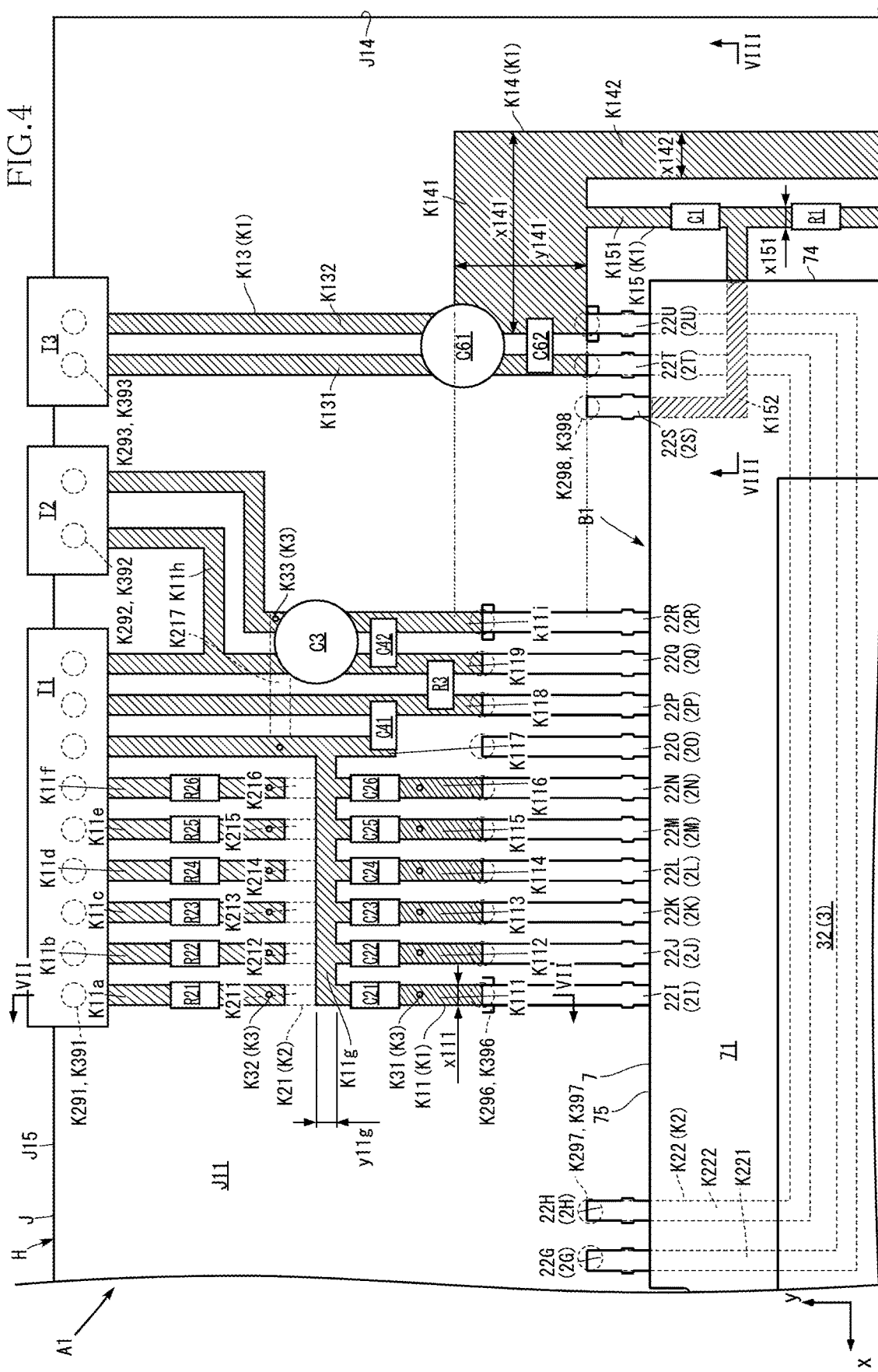
FIG. 4 is a main-part enlarged plan view showing the power converter according to the first embodiment of the present disclosure.
Figure 5:
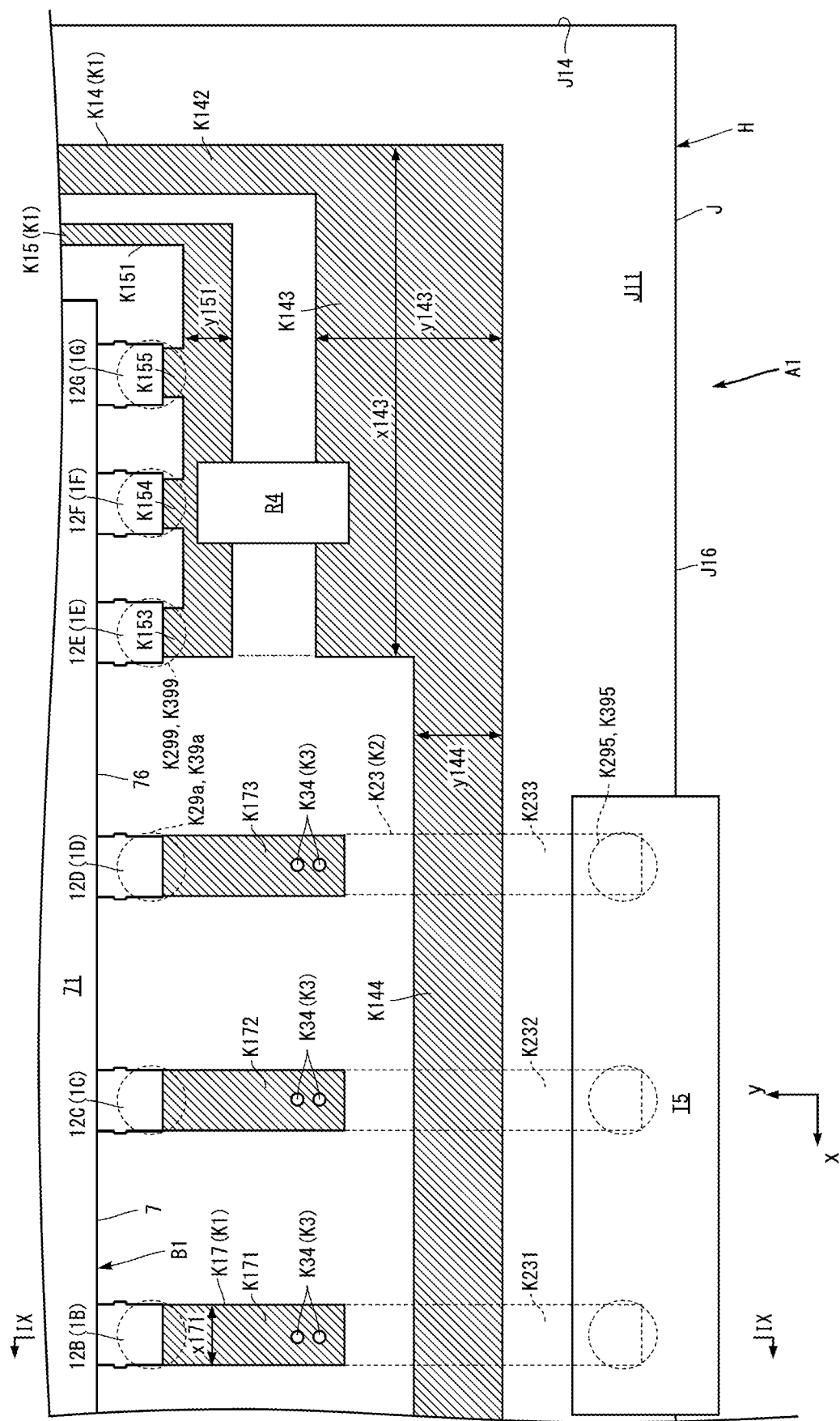
FIG. 5 is a main-part enlarged plan view showing the power converter according to the first embodiment of the present disclosure.
Figure 6:
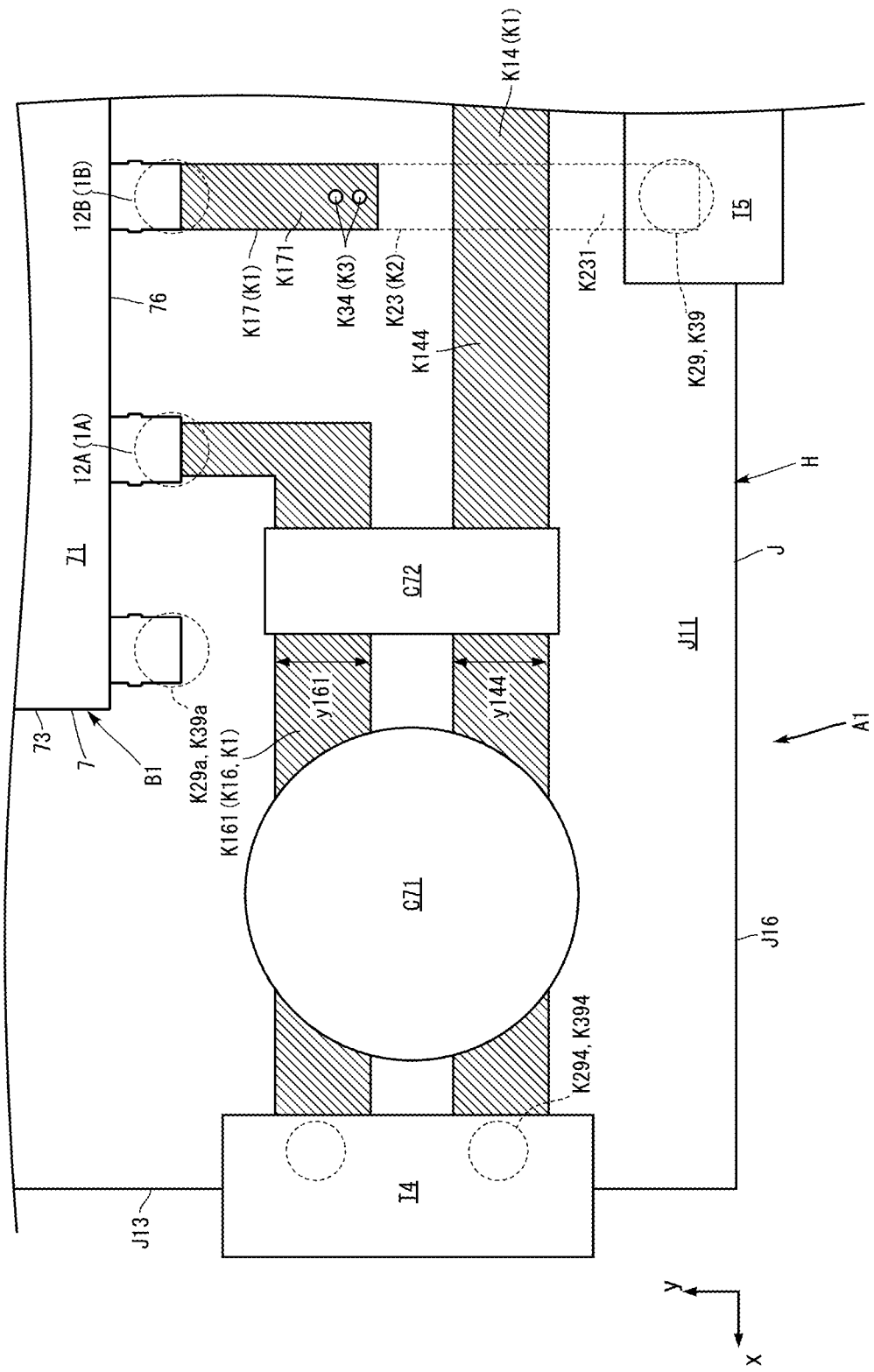
FIG. 6 is a main-part enlarged plan view showing the power converter according to the first embodiment of the present disclosure.

FIG. 1 is a plan view showing the power converter A1. FIG. 2 is a system configuration diagram showing the power converter A1. FIG. 3 is a main-part enlarged plan view showing the power converter A1. FIG. 4 is a main-part enlarged plan view showing the power converter A1. FIG. 5 is a main-part enlarged plan view showing the power converter A1. FIG. 6 is a main-part enlarged plan view showing the power converter A1. FIG. 7 is a main-part enlarged cross-sectional view along line VII-VII of FIG. 4. FIG. 8 is a main-part enlarged cross-sectional view along line VIII-VIII of FIG. 4. FIG. 9 is a main-part enlarged cross-sectional view along line IX-IX of FIG. 5. In these figures, the x direction corresponds to a second direction of the present disclosure, the y direction corresponds to a first direction of the present disclosure, and the z direction corresponds to a thickness direction of the present disclosure.

<Substrate H>

The substrate H has mounted thereon the semiconductor device B1, the plurality of resistors R, and the plurality of capacitors C. The substrate H has a base member J, a conductive portion K, and an insulating layer L. The substrate H corresponds to a first substrate of the present disclosure.

The base member J is a plate-like member made of an insulating material. The base member J may be made of glass epoxy resin. The base member J has a front surface J11, a back surface J12, a first surface J13, a second surface J14, a third surface J15, and a fourth surface J16.

The front surface J11 faces in the z direction. The back surface J12 faces opposite to the front surface J11 in the z direction. The first surface J13 is positioned between the front surface J11 and the back surface J12 in the z direction. In the illustrated example, the first surface J13 is connected to the front surface J11 and the back surface J12. The first surface J13 faces in the x direction. The second surface J14 is positioned between the front surface J11 and the back surface J12 in the z direction. In the illustrated example, the second surface J14 is connected to the front surface J11 and the back surface J12. The second surface J14 faces opposite to the first surface J13 in the x direction. The third surface J15 is positioned between the front surface J11 and the back surface J12 in the z direction. In the illustrated example, the third surface J15 is connected to the front surface J11 and the back surface J12. The third surface J15 faces in the y direction. The fourth surface J16 is positioned between the front surface J11 and the back surface J12 in the z direction. In the illustrated example, the fourth surface J16 is connected to the front surface J11 and the back surface J12. The fourth surface J16 faces opposite to the third surface J15 in the y direction.

The conductive portion K is arranged on the base member J and made of a conductive material. The material of the conductive portion K can be Cu, Ni, or Ti, for example. The conductive portion K may be formed by plating.

The conductive portion K includes a front surface portion K1, a back surface portion K2, and a plurality of through portions K3. The front surface portion K1 is arranged on the front surface J11 of the base member J. The back surface portion K2 is arranged on the back surface J12 of the base member J. Each of the through portions K3 penetrates through the base member J in the z direction, and electrically connects a part of the front surface portion K1 and a part of the back surface portion K2.

The through portions K3 include a plurality of through portions K31, a plurality of through portions K32, a plurality of through portions K33, a plurality of through portions K34, and a plurality of through portions K39. The plurality of through portions K39 include a plurality of plurality of through portions K391, a plurality of through portions K392, a plurality of through portions K393, a plurality of through portions K394, a plurality of through portions K395, a plurality of through portions K396, a plurality of through portions K397, a plurality of through portions K398, a plurality of through portions K399, and a plurality of through portions K39a.

As shown in FIG. 4, the plurality of through portions K391 are arranged in the x direction along the third surface J15 of the base member J. As shown in FIG. 7, the through portions K391 penetrate through the base member J in the z direction and reach the front surface J11 and back surface J12 of the base member J. Each of the through portions K391 has a tubular shape through which an elongated member is insertable. Although nine through portions K391 are provided in the illustrated example, the number of through portions K391 is not particularly limited.

As shown in FIG. 4, the plurality of through portions K392 are arranged in the x direction along the third surface J15 of the base member J. The plurality of through portions K392 are arranged apart from the plurality of through portions K391 in the x direction. The through portions K392 penetrate through the base member J in the z direction, and reach the front surface J11 and back surface J12 of the base member J. Each of the through portions K392 has a tubular shape through which an elongated member is insertable. Although two through portions K392 are provided in the illustrated example, the number of through portions K392 is not particularly limited.

As shown in FIG. 4, the plurality of through portions K393 are arranged in the x direction along the third surface J15 of the base member J. The plurality of through portions K393 are arranged apart from the plurality of through portions K392 in the x direction. The through portions K393 penetrate through the base member J in the z direction, and reach the front surface J11 and back surface J12 of the base member J. Each of the through portions K392 has a tubular shape through which an elongated member is insertable. Although two through portions K393 are provided in the illustrated example, the number of through portions K393 is not particularly limited.

As shown in FIG. 6, the plurality of through portions K394 are arranged in the y direction along the first surface J13 of the base member J. The through portions K394 penetrate through the base member J in the z direction, and reach the front surface J11 and back surface J12 of the base member J. Each of the through portions K394 has a tubular shape through which an elongated member is insertable. Although two through portions K394 are provided in the illustrated example, the number of through portions K394 is not particularly limited.

As shown in FIG. 5, the plurality of through portions K395 are arranged in the x direction along the fourth surface J16 of the base member J. The through portions K395 penetrate through the base member J in the z direction, and reach the front surface J11 and back surface J12 of the base member J. Each of the through portions K395 has a tubular shape through which an elongated member is insertable. Although three through portions K395 are provided in the illustrated example, the number of through portions K395 is not particularly limited.

As shown in FIG. 4, the plurality of through portions K396 are arranged closer to the fourth surface J16 in the y direction than the plurality of through portions K391, and are aligned in the x direction. As shown in FIG. 7, the through portions K396 penetrate through the base member J in the z direction and reach the front surface J11 and back surface J12 of the base member J. Each of the through portions K396 has a tubular shape through which an elongated member is insertable. Although ten through portions K396 are provided in the illustrated example, the number of through portions K396 is not particularly limited.

As shown in FIG. 3, the plurality of through portions K397 are arranged apart from the plurality of through portions K396 in the x direction toward the first surface J13. Also, the plurality of through portions K397 are arranged closer to the fourth surface J16 in the y direction than the plurality of through portions K396. The plurality of through portions K397 are arranged in the x direction. The through portions K397 penetrate through the base member J in the z direction, and reach the front surface J11 and back surface J12 of the base member J. Each of the through portions K397 has a tubular shape through which an elongated member is insertable. Although eight through portions K397 are provided in the illustrated example, the number of through portions K397 is not particularly limited.

As shown in FIG. 4, the plurality of through portions K398 are arranged apart from the plurality of through portions K396 in the x direction toward the second surface J14. Also, the plurality of through portions K398 are arranged closer to the fourth surface J16 in the y direction than the plurality of through portions K396. The plurality of through portions K398 are arranged in the x direction. The through portions K398 penetrate through the base member J in the z direction, and reach the front surface J11 and back surface J12 of the base member J. Each of the through portions K398 has a tubular shape through which an elongated member is insertable. Although three through portions K398 are provided in the illustrated example, the number of through portions K398 is not particularly limited.

As shown in FIG. 5, the plurality of through portions K399 are arranged apart from the plurality of through portions K395 in the x direction toward the second surface J14. Also, the plurality of through portions K399 are arranged closer to the third surface J15 in they direction than the plurality of through portions K395. The plurality of through portions K399 are arranged in the x direction. The through portions K399 penetrate through the base member J in the z direction, and reach the front surface J11 and back surface J12 of the base member J. Each of the through portions K399 has a tubular shape through which an elongated member is insertable. Although three through portions K399 are provided in the illustrated example, the number of through portions K399 is not particularly limited.

As shown in FIGS. 5 and 6, the plurality of through portions K39a are arranged apart from the plurality of through portions K399 in the x direction toward the first surface J13. Also, the plurality of through portions K39a are arranged at substantially the same position in the y direction as the plurality of through portions K399. The plurality of through portions K39a are arranged in the x direction. The through portions K39a penetrate through the base member J in the z direction, and reach the front surface J11 and back surface J12 of the base member J. Each of the through portions K39a has a tubular shape through which an elongated member is insertable. Although five through portions K39a are provided in the illustrated example, the number of through portions K39a is not particularly limited.

The front surface portion K1 includes a plurality of front-surface wiring portions K11, a plurality of front-surface wiring portions K12, a plurality of front-surface wiring portions K13, a plurality of front-surface wiring portions K14, a plurality of front-surface wiring portions K15, a plurality of front-surface wiring portions K16, and a plurality of front-surface wiring portions K17.

The back surface portion K2 includes a plurality of back-surface wiring portions K21, a plurality of back-surface wiring portions K22, a plurality of back-surface wiring portions K23, and a plurality of pad portions K29.

As shown in FIG. 4, the plurality of front-surface wiring portions K11 include front-surface wiring portions K111, K112, K113, K114, K115, K116, K117, K118, K119, K11a, K11b, K11c, K11d, K11e, K11f, K11g, K11h, and K11i.

As shown in FIGS. 4 and 7, the front-surface wiring portion K111 is connected to the through portion K396, and extends toward the third surface J15 in the y direction. The front-surface wiring portion K111 includes one discontinuous portion. The portion is where an electronic component, described below, is mounted. The front-surface wiring portion K11a is arranged apart from the front-surface wiring portion K11i in the y direction toward the third surface J15. The front-surface wiring portion K11a extends in the y direction, and overlaps with the front-surface wiring portion K111 as viewed in the y direction. The front-surface wiring portion K11a is connected to one of the through portions K391. The front-surface wiring portion K11a includes one discontinuous portion. The portion is where an electronic component, described below, is mounted.

As shown in FIG. 4, the plurality of back-surface wiring portions K21 include back-surface wiring portions K211, K212, K213, K214, K215, K216, and K217. As shown in FIGS. 4 and 7, the back-surface wiring portion 211 extends in the y direction, and is arranged at a position that overlaps with the front-surface wiring portion K111 in the x direction.

The through portion K31 shown in FIG. 7 penetrates through the base member J in the z direction and reaches the front surface J11 and back surface J12 of the base member J. The through portion K31 is connected to both the front-surface wiring portion K111 and the back-surface wiring portion K211. The front-surface wiring portion K11i has a portion extending from the through portion K31 toward the third surface J15 in the y direction.

The through portion K32 shown in FIG. 7 penetrates through the base member J in the z direction and reach the front surface J11 and back surface J12 of the base member J. The through portion K32 is connected to both the front-surface wiring portion K11a and the back-surface wiring portion K211.

As shown in FIG. 4, the front-surface wiring portion K112 is arranged closer to the second surface J14 in the x direction than the front-surface wiring portion K111. The front-surface wiring portion K112 is connected to one of the through portions K396, and extends toward the third surface J15 in they direction. The front-surface wiring portion K112 includes one discontinuous portion. The portion is where an electronic component, described below, is mounted. The front-surface wiring portion K11b is arranged apart from the front-surface wiring portion K112 in the y direction toward the third surface J15. The front-surface wiring portion K11b extends in the y direction, and overlaps with the front-surface wiring portion K112 as viewed in the y direction. The front-surface wiring portion K11b is connected to one of the through portions K391. The front-surface wiring portion K11b includes one discontinuous portion. The portion is where an electronic component, described below, is mounted.

As shown in FIG. 4, the back-surface wiring portion K212 extends in the y direction, and is arranged at a position that overlaps with the front-surface wiring portion K112 in the x direction.

One of the through portions K31 is connected to both the front-surface wiring portion K112 and the back-surface wiring portion K212. The front-surface wiring portion K112 has a portion extending from the through portion K31 toward the third surface J15 in the y direction. One of the through portions K32 is connected to both the front-surface wiring portion K11b and the back-surface wiring portion K212.

As shown in FIG. 4, the front-surface wiring portion K113 is arranged closer to the second surface J14 in the x direction than the front-surface wiring portion K112. The front-surface wiring portion K113 is connected to one of the through portions K396, and extends toward the third surface J15 in they direction. The front-surface wiring portion K113 includes one discontinuous portion. The portion is where an electronic component, described below, is mounted. The front-surface wiring portion K11c is arranged apart from the front-surface wiring portion K113 in the y direction toward the third surface J15. The front-surface wiring portion K11c extends in the y direction, and overlaps with the front-surface wiring portion K113 as viewed in the y direction. The front-surface wiring portion K11c is connected to one of the through portions K391. The front-surface wiring portion K11c includes one discontinuous portion. The portion is where an electronic component, described below, is mounted.

As shown in FIG. 4, the back-surface wiring portion K213 extends in the y direction, and is arranged at a position that overlaps with the front-surface wiring portion K113 in the x direction.

One of the through portions K31 is connected to both the front-surface wiring portion K113 and the back-surface wiring portion K213. The front-surface wiring portion K113 has a portion extending from the through portion K31 toward the third surface J15 in the y direction. One of the through portions K32 is connected to both the front-surface wiring portion K11c and the back-surface wiring portion K213.

As shown in FIG. 4, the front-surface wiring portion K114 is arranged closer to the second surface J14 in the x direction than the front-surface wiring portion K113. The front-surface wiring portion K114 is connected to one of the through portions K396, and extends toward the third surface J15 in they direction. The front-surface wiring portion K114 includes one discontinuous portion. The portion is where an electronic component, described below, is mounted. The front-surface wiring portion K11d is arranged apart from the front-surface wiring portion K114 in the y direction toward the third surface J15. The front-surface wiring portion K11d extends in the y direction, and overlaps with the front-surface wiring portion K114 as viewed in the y direction. The front-surface wiring portion K11d is connected to one of the through portions K391. The front-surface wiring portion K11d includes one discontinuous portion. The portion is where an electronic component, described below, is mounted.

As shown in FIG. 4, the back-surface wiring portion K214 extends in the y direction, and is arranged at a position that overlaps with the front-surface wiring portion K114 in the x direction.

One of the through portions K31 is connected to both the front-surface wiring portion K114 and the back-surface wiring portion K214. The front-surface wiring portion K114 has a portion extending from the through portion K31 toward the third surface J15 in the y direction. One of the through portions K32 is connected to both the front-surface wiring portion K11d and the back-surface wiring portion K214.

As shown in FIG. 4, the front-surface wiring portion K115 is arranged closer to the second surface J14 in the x direction than the front-surface wiring portion K114. The front-surface wiring portion K115 is connected to one of the through portions K396, and extends toward the third surface J15 in they direction. The front-surface wiring portion K115 includes one discontinuous portion. The portion is where an electronic component, described below, is mounted. The front-surface wiring portion K11e is arranged apart from the front-surface wiring portion K115 in the y direction toward the third surface J15. The front-surface wiring portion K11e extends in the y direction, and overlaps with the front-surface wiring portion K115 as viewed in the y direction. The front-surface wiring portion K11e is connected to one of the through portions K391. The front-surface wiring portion K11e includes one discontinuous portion. The portion is where an electronic component, described below, is mounted.

As shown in FIG. 4, the back-surface wiring portion K215 extends in the y direction, and is arranged at a position that overlaps with the front-surface wiring portion K115 in the x direction.

One of the through portions K31 is connected to both the front-surface wiring portion K115 and the back-surface wiring portion K215. The front-surface wiring portion K115 has a portion extending from the through portion K31 toward the third surface J15 in the y direction. One of the through portions K32 is connected to both the front-surface wiring portion K11e and the back-surface wiring portion K215.

As shown in FIG. 4, the front-surface wiring portion K116 is arranged closer to the second surface J14 in the x direction than the front-surface wiring portion K115. The front-surface wiring portion K116 is connected to one of the through portions K396, and extends toward the third surface J15 in they direction. The front-surface wiring portion K116 includes one discontinuous portion. The portion is where an electronic component, described below, is mounted. The front-surface wiring portion K11f is arranged apart from the front-surface wiring portion K116 in the y direction toward the third surface J15. The front-surface wiring portion K11f extends in the y direction, and overlaps with the front-surface wiring portion K116 as viewed in the y direction. The front-surface wiring portion K11f is connected to one of the through portions K391. The front-surface wiring portion K11f includes one discontinuous portion. The portion is where an electronic component, described below, is mounted.

As shown in FIG. 4, the back-surface wiring portion K216 extends in the y direction, and is arranged at a position that overlaps with the front-surface wiring portion K116 in the x direction.

One of the through portions K31 is connected to both the front-surface wiring portion K116 and the back-surface wiring portion K216. The front-surface wiring portion K116 has a portion extending from the through portion K31 toward the third surface J15 in the y direction. One of the through portions K32 is connected to both the front-surface wiring portion K11f and the back-surface wiring portion K216.

As shown in FIG. 4, the front-surface wiring portion K117 is arranged closer to the second surface J14 in the x direction than the front-surface wiring portion K116. The front-surface wiring portion K117 is arranged closer to the third surface J15 than one of the through portions K396 in the y direction, and extends in the y direction. The front-surface wiring portion K117 is connected to one of the through portions K391.

As shown in FIG. 4, the front-surface wiring portion K118 is arranged closer to the second surface J14 in the x direction than the front-surface wiring portion K117. The front-surface wiring portion K118 is connected to one of the through portions K396, and extends in the y direction. The front-surface wiring portion K118 is connected to one of the through portions K391.

As shown in FIG. 4, the front-surface wiring portion K119 is arranged closer to the second surface J14 in the x direction than the front-surface wiring portion K118. The front-surface wiring portion K119 is connected to one of the through portions K396, and extends in the y direction. The front-surface wiring portion K119 is connected to one of the through portions K391.

As shown in FIG. 4, the front-surface wiring portion K11$g$ extends in the x direction, and is connected to ends of the front-surface wiring portions K111, K112, K113, K114, K115, and K116, which are ends closer to the third surface J15 than the other ends in the y direction. The front-surface wiring portion K11$g$ is also connected to the front-surface wiring portion K117.

As shown in FIG. 4, the front-surface wiring portion K11$h$ is connected to a midway portion of the front-surface wiring portion K119 in the y direction. The front-surface wiring portion K11$h$ has a portion extending from the front-surface wiring portion K119 toward the second surface J14 in the x direction, and a portion extending toward the third surface J15 in the y direction. The front-surface wiring portion K11$h$ is connected to one of the through portions K392.

As shown in FIG. 4, the front-surface wiring portion K11$i$ is arranged closer to the second surface J14 in the x direction than the front-surface wiring portion K119. The front-surface wiring portion K11$i$ is connected to one of the through portions K396. The front-surface wiring portion K11$i$ has a portion extending from the through portion K396 toward the third surface J15 in the y direction, a portion extending toward the second surface J14 in the x direction, and a portion extending toward the third surface J15 in the y direction. The front-surface wiring portion K11$i$ is connected to one of the through portions K392.

The back-surface wiring portion K217 extends in the x direction, and overlaps with the front-surface wiring portions K117, K118, K119, and K11$i$ as viewed in the z direction. Furthermore, the back-surface wiring portion K217 overlaps with the front-surface wiring portion K11$g$ as viewed in the x direction.

As shown in FIG. 4, the back-surface wiring portion K217 is connected to two through portions K33. One of the through portions K33 is connected to the front-surface wiring portion K117 and the back-surface wiring portion K217. The other through portion K33 is connected to both the front-surface wiring portion K11$i$ and the back-surface wiring portion K217.

As shown in FIG. 3, the plurality of front-surface wiring portions K12 include front-surface wiring portions K121, K122, K123, K124, K125, and K126.

As shown in FIG. 3, the front-surface wiring portion K121 is connected to one of the through portions K397, and has a portion extending toward the third surface J15 in the y direction, and a portion extending toward the first surface J13 in the x direction.

As shown in FIG. 3, the front-surface wiring portion K122 is arranged closer to the second surface J14 than the front-surface wiring portion K121 in the x direction. The front-surface wiring portion K122 is connected to one of the through portions K397, and has a portion extending toward the third surface J15 in the y direction, and a portion extending toward the first surface J13 in the x direction.

As shown in FIG. 3, the front-surface wiring portion K123 is arranged closer to the second surface J14 than the front-surface wiring portion K122 in the x direction. The front-surface wiring portion K123 is connected to one of the through portions K397, and extends toward the third surface J15 in the y direction.

As shown in FIG. 3, the front-surface wiring portion K124 is arranged closer to the second surface J14 than the front-surface wiring portion K123 in the x direction. The front-surface wiring portion K124 is connected to one of the through portions K397, and extends toward the third surface J15 in the y direction.

As shown in FIG. 3, the front-surface wiring portion K125 is arranged closer to the second surface J14 than the front-surface wiring portion K124 in the x direction. The front-surface wiring portion K125 is connected to one of the through portions K397, and extends toward the third surface J15 in the y direction.

As shown in FIG. 3, the front-surface wiring portion K126 is arranged closer to the second surface J14 than the front-surface wiring portion K125 in the x direction. The front-surface wiring portion K126 is connected to one of the through portions K397, and extends toward the third surface J15 in the y direction.

As shown in FIG. 4, the plurality of front-surface wiring portions K13 include front-surface wiring portions K131 and K132.

As shown in FIG. 4, the front-surface wiring portion K131 is arranged closer to the second surface J14 than the front-surface wiring portion K11$i$ in the x direction. The front-surface wiring portion K131 is connected to one of the through portions K398. The front-surface wiring portion K131 extends in they direction, and is connected to one of the through portions K393.

As shown in FIG. 4, the front-surface wiring portion K132 is arranged closer to the second surface J14 than the front-surface wiring portion K131 in the x direction. The front-surface wiring portion K132 is connected to one of the through portions K398. The front-surface wiring portion K132 extends in they direction, and is connected to one of the through portions K393.

As shown in FIGS. 4, 5, and 6, the plurality of front-surface wiring portions K14 include a first portion K141, a second portion K142, a third portion K143, and a fourth portion K144.

The first portion K141 is connected to the front-surface wiring portion K132 of the front-surface wiring portions K13, on the side of the second surface J14 in the x direction. For example, a dimension y141, which is the dimension of the first portion K141 in the y direction, is larger than a dimension y11$g$, which is the dimension of the front-surface wiring portion K11$g$ in the y direction. The first portion K141 overlaps with the plurality of through portions K396 as viewed in the x direction. A dimension x141, which is the dimension of the first portion K141 in the x direction, is larger than the dimension y141. In the illustrated example, the first portion K141 has a rectangular shape.

The second portion K142 is connected to a portion of the first portion K141 that is located on the side of the fourth surface J16 in the y direction and on the side of the second surface J14 in the x direction. The second portion K142 extends from the first portion K141 to the fourth surface J16 along the y direction. A dimension x142, which is the dimension of the second portion K142 in the x direction, is smaller than the dimension x141. The dimension x142 is larger than a dimension x111, which is the dimension of the front-surface wiring portion K111 in the x direction.

The third portion K143 is connected to the second portion K142 on the side of the fourth surface J16 in the y direction. A dimension x143, which is the dimension of the third portion K143 in the x direction, is larger than the dimension x141. A dimension y143, which is the dimension of the third portion K143 in the y direction, is larger than the dimension y141. The third portion K143 overlaps with the three through portions K399 as viewed in the y direction. In the illustrated example, the third portion K143 has a rectangular shape.

The fourth portion K144 is connected to the third portion K143 on the side of the first surface J13 in the x direction. The fourth portion K144 extends along the fourth surface J16 in the x direction, and is connected to one of the two through portions K394 that is located closer to the fourth surface J16 in the y direction. A dimension y144, which is the dimension of the fourth portion K144 in the y direction, is smaller than the dimension y143 in the y direction. The dimension y144 is larger than the dimension y11g.

As shown in FIGS. 4 and 5, the plurality of front-surface wiring portions K15 include a first portion K151, a second portion K152, a third portion K153, a fourth portion K154, and a fifth portion K155.

The first portion K151 is connected to the first portion K141 of the front-surface wiring portions K14 on the side of the fourth surface J16 in the y direction. The first portion K151 is arranged apart from the second portion K142 in the x direction toward the first surface J13. The first portion K151 has one portion extending from the first portion K141 toward the fourth surface J16 along the y direction, and another portion extending from an end of the one portion in the y direction toward the first surface J13 in the x direction. A dimension x151, which is the dimension in the x direction of the portion of the first portion K151 extending in the y direction, is smaller than the dimension x142. The portion of the first portion K151 extending in the y direction has two discontinuous portions. These portions are where electronic components, described below, are mounted. A dimension y151, which is the dimension in the y direction of the portion of the first portion K151 extending in the x direction, is smaller than the dimension y143. The dimension y151 is larger than the dimension y11g.

The second portion K152 is connected to one of the three through portions K398 that is located closest to the first surface J13 in the x direction. The second portion K152 has one portion extending from the through portion K398 toward the fourth surface J16 in the y direction, and another portion extending from the one portion toward the second surface J14 in the x direction.

The third portion K153 is connected to an end of the portion of the first portion K151 extending in the x direction, specifically, the end being on the side of the first surface J13. The third portion K153 extends toward the third surface J15 in the y direction. The third portion K153 is connected to one of the three through portions K399 that is located closest to the first surface J13 in the x direction.

The fourth portion K154 is connected to the portion of the first portion K151 extending in the x direction. The fourth portion K154 is spaced apart from the third portion K153 in the x direction toward the second surface J14. The fourth portion K154 extends, from the portion of the first portion K151 extending in the x direction, toward the third surface J15 in the y direction. The fourth portion K154 is connected to one of the three through portions K399 that is located in the middle in the x direction.

The fifth portion K155 is connected to the portion of the first portion K151 extending in the x direction. The fifth portion K155 is spaced apart from the fourth portion K154 in the x direction toward the second surface J14. The fifth portion K155 extends, from the portion of the first portion K151 extending in the x direction, toward the third surface J15 in they direction. The fourth portion K154 is connected to one of the three through portions K399 that is located closest to the second surface J14 in the x direction.

As shown in FIG. 4, the plurality of back-surface wiring portions K22 include a back-surface wiring portion K221 and a back-surface wiring portion K222.

The back-surface wiring portion K221 is connected to one of the plurality of through portions K397 that is located second from the second surface J14 in the x direction. The back-surface wiring portion K221 has one portion extending from the through portion K397 toward the fourth surface J16 in the y direction, another portion extending from the one portion toward the second surface J14, and yet another portion extending from the other portion toward the third surface J15 in the y direction and connected to one of the three through portions K398 that is located closest to the second surface J14 in the x direction. As shown in FIGS. 4 and 8, the back-surface wiring portion K221 overlaps with the second portion K152 in the front-surface wiring portions K15 as viewed in the z direction.

The back-surface wiring portion K222 is connected to one of the plurality of through portions K397 that is located closest to the second surface J14 in the x direction. The back-surface wiring portion K222 has one portion extending from the through portion K397 toward the fourth surface J16 in the y direction, another portion extending from the one portion toward the second surface J14, and yet another portion extending from the other portion toward the third surface J15 in the y direction and connected to one of the three through portions K398 that is located in the middle in the x direction. As shown in FIGS. 4 and 8, the back-surface wiring portion K222 overlaps with the second portion K152 in the front-surface wiring portions K15 as viewed in the z direction.

As shown in FIG. 4, the plurality of front-surface wiring portions K16 include a front-surface wiring portion K161. The front-surface wiring portion K161 is connected to one of the two through portions K394 that is located closer to the third surface J15 in the y direction. The front-surface wiring portion K161 has one portion extending from the through portion K392 toward the second surface J14 in the x direction, and another portion extending from the one portion toward the third surface J15 in they direction and connected to one of two through portions K39a that is located closer to the second surface J14 in the x direction. A dimension y161, which is a dimension in the y direction of the portion of the front-surface wiring portion K161 that extends in the x direction, is substantially the same as the dimension y144.

As shown in FIG. 5, the plurality of front-surface wiring portions K17 include a front-surface wiring portion K171, a front-surface wiring portion K172, and a front-surface wiring portion K173.

As shown in FIGS. 5 and 9, the front-surface wiring portion K171 is connected to one of the plurality of through portions K39a that is located third from the second surface J14 in the x direction, and extends toward the fourth surface J16 in the y direction. A dimension x171, which is the dimension of the front-surface wiring portion K171 in the x direction, is larger than the dimension x111.

As shown in FIG. 5, the plurality of back-surface wiring portions K23 include back-surface wiring portions K231, K232, and K233. As shown in FIGS. 5 and 9, the back-surface wiring portion 231 extends in the y direction, and is arranged at a position that overlaps with the front-surface wiring portion K171 in the x direction. The back-surface wiring portion K231 is connected to one of the three through portions K395 that is located closest to the first surface J13 in the x direction. Furthermore, an end of the back-surface wiring portion K231 overlaps with an end of the front-surface wiring portion K171 as viewed in the z direction.

The plurality of through portions K34 shown in FIGS. 5 and 9 penetrate through the base member J in the z direction and reach the front surface J11 and back surface J12 of the base member J. These through portions K34 are connected to both the front-surface wiring portion K171 and the back-surface wiring portion K231. The number of through portions K34 is not particularly limited, and may be three or more. The plurality of through portions K34 are not necessarily aligned in one row in the y direction, and may be aligned in multiple rows.

As shown in FIG. 5, the front-surface wiring portion K172 is connected to one of the plurality of through portions K39a that is located second from the second surface J14 in the x direction, and extends toward the fourth surface J16 in the y direction.

As shown in FIG. 5, the back-surface wiring portion K232 extends in the y direction, and is arranged at a position that overlaps with the front-surface wiring portion K172 in the x direction. The back-surface wiring portion K232 is connected to one of the three through portions K395 that is located in the middle in the x direction. Furthermore, an end of the back-surface wiring portion K232 overlaps with an end of the front-surface wiring portion K172 as viewed in the z direction.

As shown in FIG. 5, two of the through portions K34 are connected to both the front-surface wiring portion K172 and the back-surface wiring portion K232. The number of through portions K34 is not particularly limited, and may be three or more. The plurality of through portions K34 are not necessarily aligned in one row in the y direction, and may be aligned in multiple rows.

As shown in FIG. 5, the front-surface wiring portion K173 is connected to one of the plurality of through portions K39a that is located closest to the second surface J14 in the x direction, and extends toward the fourth surface J16 in the y direction.

As shown in FIG. 5, the back-surface wiring portion K233 extends in the y direction, and is arranged at a position that overlaps with the front-surface wiring portion K173 in the x direction. The back-surface wiring portion K233 is connected to one of the three through portions K395 that is located closest to the second surface J14 in the x direction. Furthermore, an end of the back-surface wiring portion K233 overlaps with an end of the front-surface wiring portion K173 as viewed in the z direction.

As shown in FIG. 5, two of the through portions K34 are connected to both the front-surface wiring portion K173 and the back-surface wiring portion K233. The number of through portions K34 is not particularly limited, and may be three or more. The plurality of through portions K34 are not necessarily aligned in one row in the y direction, and may be aligned in multiple rows.

The insulating layer L covers a part of the conductive portion K, and exposes the remaining part of the conductive portion K. The insulating layer L is made of a resist film, for example. The insulating layer L is omitted in FIG. 1 and FIGS. 3 to 6.

As shown in FIGS. 7 to 9, the insulating layer L includes a first surface portion L1 and a second surface portion L2. The first surface portion L1 is arranged on the front surface J11 of the base member J, and partially covers the front surface portion K1 of the conductive portion K. The second surface portion L2 is arranged on the back surface J12, and partially covers the back surface portion K2 of the conductive portion K.

<Connecting Terminals T1, T2, T3, T4, and T5>

The connecting terminals T1, T2, T3, T4, and T5 are attached to the substrate H and connected to the conductive portion K.

As shown in FIGS. 1, 4, and 7, the connecting terminal T1 is arranged along the third surface J15 of the base member J. In the illustrated example, the connecting terminal T1 overlaps with the third surface J15 as viewed in the z direction. In the connecting terminal T1, a plurality of terminal pins are inserted in the plurality of through portions K391 from the front surface J11 of the base member J, and conductively bonded to the plurality of pad portions K291 with solder or the like. In the illustrated example, the connecting terminal T1 is connected to the front-surface wiring portions K11a, K11b, K11c, K11d, K11e, K11f, K118, and K119. As shown in FIG. 1, the connecting terminal T1 is connected to, for example, a microcontroller unit P1 provided outside the power converter A1. The connecting terminal T1 corresponds to a first connecting terminal of the present disclosure.

As shown in FIGS. 1 and 4, the connecting terminal T2 is arranged along the third surface J15 of the base member J. In the illustrated example, the connecting terminal T2 overlaps with the third surface J15 as viewed in the z direction. The connecting terminal T2 is spaced apart from the connecting terminal T1 in the x direction toward the second surface J14. In the connecting terminal T2, a plurality of terminal pins are inserted in the plurality of through portions K392 from the front surface J11 of the base member J, and conductively bonded to the plurality of pad portions K292 with solder or the like. In the illustrated example, the connecting terminal T2 is connected to the front-surface wiring portions K11h and K11i. As shown in FIG. 1, the connecting terminal T2 is connected to, for example, a power supply E1 provided outside the power converter A1. The power supply E1 is 5 V DC power, for example, and is used for driving a primary control circuit.

As shown in FIGS. 1 and 4, the connecting terminal T3 is arranged along the third surface J15 of the base member J. In the illustrated example, the connecting terminal T3 overlaps with the third surface J15 as viewed in the z direction. The connecting terminal T3 is spaced apart from the connecting terminal T2 in the x direction toward the second surface J14. In the connecting terminal T3, a plurality of terminal pins are inserted in the plurality of through portions K393 from the front surface J11 of the base member J, and conductively bonded to the plurality of pad portions K293 with solder or the like. In the illustrated example, the connecting terminal T3 is connected to the front-surface wiring portions K131 and K132. As shown in FIG. 1, the connecting terminal T3 is connected to, for example, a power supply E2 provided outside the power converter A1. The power supply E2 is 15V DC power, for example, and is used for controlling a secondary power circuit.

As shown in FIGS. 1 and 6, the connecting terminal T4 is arranged along the first surface J13 of the base member J. In the illustrated example, the connecting terminal T4 overlaps with the first surface J13 as viewed in the z direction. In the connecting terminal T4, a plurality of terminal pins are inserted in the plurality of through portions K394 from the front surface J11 of the base member J, and conductively bonded to the plurality of pad portions K294 with solder or the like. In the illustrated example, the connecting terminal T4 is connected to the fourth portion K144 and the front—surface wiring portion K161. As shown in FIG. 1, the connecting terminal T4 is connected to, for example, the power supply E3 provided outside the power converter A1. The power supply E3 is 600V DC power, for example, and is an inverter power supply for the secondary power circuit.

As shown in FIGS. 1 and 5, the connecting terminal T5 is arranged along the fourth surface J16 of the base member J. In the illustrated example, the connecting terminal T5 overlaps with the fourth surface J16 as viewed in the z direction. In the connecting terminal T5, a plurality of terminal pins are inserted in the plurality of through portions K394 from the front surface J11 of the base member J, and conductively bonded to the plurality of pad portions K295 with solder or the like. In the illustrated example, the connecting terminal T5 is connected to the back-surface wiring portions K231, K232 and K233. As shown in FIG. 1, the connecting terminal T5 is connected to, for example, the motor M1 provided outside the power converter A1. The motor M1 is a three-phase AC motor, for example, and receives power from the power converter A1. The connecting terminal T5 corresponds to a second connecting terminal of the present disclosure.

<Resistors R and Capacitors C>

The plurality of resistors R and the plurality of capacitors C are mounted on the substrate H, and constitute circuits of the power converter A1 shown in FIG. 2 together with the semiconductor device B1. The number, arrangements, etc., of the plurality of resistors R and the plurality of capacitors C in the power converter A1 shown are merely examples, and the present disclosure is not limited by these. It is possible to use other resistors and capacitors than the plurality of resistors R and the plurality of capacitors C shown or to use different type of electronic components. In the following description, the plurality of resistors R and the plurality of capacitors C are appropriately provided with reference numbers to distinguish them from each other.

As shown in FIGS. 1, 2, and 4, a resistor R1 and a capacitor C1 are mounted on the first portion K151. The resistor R1 is mounted on one of the two discontinuous portions of the first portion K151, specifically, the one being closer to the fourth surface J16 in the y direction. The resistor R1 is arranged opposite to the first portion K141 with respect to the connecting portion between the first portion K151 and the second portion K152. The resistor R1 is arranged closer to the third surface J15 in the y direction than the middle of the portion of the first portion K151 extending in the y direction. The capacitor C1 is mounted on one of the two discontinuous portions of the first portion K151, specifically, the one being positioned between the second portion K152 and the first portion K141.

As shown in FIGS. 4 and 7, a capacitor C21 is mounted on the front-surface wiring portion K111. The capacitor C21 is mounted on the discontinuous portion of the front-surface wiring portion K111. The capacitor C21 is positioned between the through portion K31 connected to the front-surface wiring portion K11i and the front-surface wiring portion K11g. A resistor R21 is mounted on the discontinuous portion of the front-surface wiring portion K11a. The resistor R21 is positioned between the through portion K32 connected to the front-surface wiring portion K11a and the through portion K391.

As shown in FIG. 4, a capacitor C22 is mounted on the front-surface wiring portion K112. The capacitor C22 is mounted on the discontinuous portion of the front-surface wiring portion K112. The capacitor C22 is positioned between the through portion K31 connected to the front-surface wiring portion K112 and the front-surface wiring portion K11g. A resistor R22 is mounted on the discontinuous portion of the front-surface wiring portion K11b. The resistor R22 is positioned between the through portion K32 connected to the front-surface wiring portion K11b and the through portion K391.

As shown in FIG. 4, a capacitor C23 is mounted on the front-surface wiring portion K113. The capacitor C23 is mounted on the discontinuous portion of the front-surface wiring portion K113. The capacitor C23 is positioned between the through portion K31 connected to the front-surface wiring portion K113 and the front-surface wiring portion K11g. A resistor R23 is mounted on the discontinuous portion of the front-surface wiring portion K11c. The resistor R23 is positioned between the through portion K32 connected to the front-surface wiring portion K11c and the through portion K391.

As shown in FIG. 4, a capacitor C24 is mounted on the front-surface wiring portion K114. The capacitor C24 is mounted on the discontinuous portion of the front-surface wiring portion K114. The capacitor C24 is positioned between the through portion K31 connected to the front-surface wiring portion K114 and the front-surface wiring portion K11g. A resistor R24 is mounted on the discontinuous portion of the front-surface wiring portion K11d. The resistor R24 is positioned between the through portion K32 connected to the front-surface wiring portion K11d and the through portion K391.

As shown in FIG. 4, a capacitor C25 is mounted on the front-surface wiring portion K115. The capacitor C25 is mounted on the discontinuous portion of the front-surface wiring portion K115. The capacitor C25 is positioned between the through portion K31 connected to the front-surface wiring portion K115 and the front-surface wiring portion K11g. A resistor R25 is mounted on the discontinuous portion of the front-surface wiring portion K11e. The resistor R25 is positioned between the through portion K32 connected to the front-surface wiring portion K11e and the through portion K391.

As shown in FIG. 4, a capacitor C26 is mounted on the front-surface wiring portion K116. The capacitor C26 is mounted on the discontinuous portion of the front-surface wiring portion K116. The capacitor C26 is positioned between the through portion K31 connected to the front-surface wiring portion K116 and the front-surface wiring portion K11g. A resistor R26 is mounted on the discontinuous portion of the front-surface wiring portion K11f. The resistor R26 is positioned between the through portion K32 connected to the front-surface wiring portion K11f and the through portion K391.

The capacitors C21, C22, C23, C24, C25, and C26 are each connected to the front-surface wiring portion K11g in series. Each of the capacitors C21, C22, C23, C24, C25, and C26 corresponds to a first capacitor of the present disclosure. The front-surface wiring portion K11g corresponds to a second front-surface wiring portion K11g of the present disclosure.

As shown in FIG. 4, a resistor R3 is mounted on the front-surface wiring portion K118 and the front-surface wiring portion K119.

As shown in FIG. 4, a capacitor C3 is mounted on the front-surface wiring portion K119 and the front-surface wiring portion K11i. The capacitor C3 is an electrolytic capacitor, for example.

As shown in FIG. 5, a resistor R4 is mounted on the third portion K143 in the front-surface wiring portions K14 and the first portion K151. The resistor R4 is positioned closer to the fourth surface J16 in the y direction than the plurality of through portions K399.

As shown in FIG. 4, a capacitor C41 is mounted on the front-surface wiring portion K117 and the front-surface wiring portion K118. A capacitor C42 is mounted on the front-surface wiring portion K119 and the front-surface wiring portion K11i. The capacitor C42 is positioned between the resistor R3 and the capacitor C3 in the y direction.

As shown in FIG. 3, a capacitor C51 is mounted on the front-surface wiring portion K121 and the front-surface wiring portion K122. A capacitor C54 is mounted on the front-surface wiring portion K121 and the front-surface wiring portion K122. The capacitor C54 is positioned between the capacitor C51 and the through portion K397. The capacitor C51 has a larger capacitance than the capacitor C54, and is larger than the capacitor C54 as viewed in the z direction. The capacitor C51 is an electrolytic capacitor, for example.

As shown in FIG. 3, a capacitor C52 is mounted on the front-surface wiring portion K123 and the front-surface wiring portion K124. A capacitor C55 is mounted on the front-surface wiring portion K123 and the front-surface wiring portion K124. The capacitor C55 is positioned between the capacitor C52 and the through portion K397. The capacitor C52 has a larger capacitance than the capacitor C55, and is larger than the capacitor C55 as viewed in the z direction. The capacitor C52 is an electrolytic capacitor, for example.

As shown in FIG. 3, a capacitor C53 is mounted on the front-surface wiring portion K125 and the front-surface wiring portion K126. A capacitor C56 is mounted on the front-surface wiring portion K125 and the front-surface wiring portion K126. The capacitor C56 is positioned between the capacitor C53 and the through portion K397. The capacitor C53 has a larger capacitance than the capacitor C56, and is larger than the capacitor C56 as viewed in the z direction. The capacitor C53 is an electrolytic capacitor, for example.

As shown in FIG. 4, a capacitor C61 is mounted on the front-surface wiring portion K131 and the front-surface wiring portion K132. In the illustrated example, the capacitor C61 overlaps with a portion of the first portion K141 as viewed in the z direction. A capacitor C62 is mounted on the front-surface wiring portion K131 and the front-surface wiring portion K132. The capacitor C62 is positioned between the capacitor C61 and the through portion K398. The capacitor C61 has a larger capacitance than the capacitor C62, and is larger than the capacitor C62 as viewed in the z direction.

As shown in FIG. 6, a capacitor C71 is mounted on the fourth portion K144 in the front-surface wiring portions K14 and on the portion of the front-surface wiring portion K161 extending in the x direction. A capacitor C72 is mounted on the fourth portion K144 in the front-surface wiring portions K14 and on the portion of the front-surface wiring portion K161 extending in the x direction. The capacitor C72 is positioned closer to the second surface J14 in the x direction than the capacitor C71. The capacitor C71 has a larger capacitance than the capacitor C72, and is larger than the capacitor C72 as viewed in the z direction. The capacitor C71 is an electrolytic capacitor, for example.

<Semiconductor Device B1>

As shown in FIG. 1, the semiconductor device B1 includes leads 1A, 1B, 1C, 1D, 1E, 1F, and 1G, and leads 2A, 2B, 2C, 2D, 2E, 2F, 2G, 2H, 2I, 2J, 2K, 2L, 2M, 2N, 2O, 2P, 2Q, 2R, 2S, 2T, and 2U. Details of these are described below.

As shown in FIGS. 5 and 6, the leads 1A, 1B, 1C, and 1D are connected to the plurality of through portions K39a. As such, the lead 1A is electrically connected to the front-surface wiring portion K161. The lead 1B is electrically connected to the front-surface wiring portion K171. The lead 1C is electrically connected to the front-surface wiring portion K172. The lead 1D is electrically connected to the front-surface wiring portion K173.

As shown in FIG. 5, the leads 1E, 1F, and 1G are connected to the plurality of through portions K399. As such, the lead 1E is electrically connected to the third portion K153. The lead 1F is electrically connected to the fourth portion K154. The lead 1G is electrically connected to the fifth portion K155.

As shown in FIG. 3, the leads 2A, 2B, 2C, 2D, 2E, 2F, 2G, and 2H are connected to the plurality of through portions K397. As such, the lead 2A is electrically connected to the front-surface wiring portion K121. The lead 2B is electrically connected to the front-surface wiring portion K122. The lead 2C is electrically connected to the front-surface wiring portion K123. The lead 2D is electrically connected to the front-surface wiring portion K124. The lead 2E is electrically connected to the front-surface wiring portion K125. The lead 2F is electrically connected to the front-surface wiring portion K126. The lead 2G is electrically connected to the back-surface wiring portion K221. The lead 2H is electrically connected to the back-surface wiring portion K222.

As shown in FIG. 4, the leads 2I, 2J, 2K, 2L, 2M, 2N, 2O, 2P, 2Q, and 2R are connected to the plurality of through portions K396. As such, the lead 2I is electrically connected to the front-surface wiring portion K111. The lead 2J is electrically connected to the front-surface wiring portion K112. The lead 2K is electrically connected to the front-surface wiring portion K113. The lead 2L is electrically connected to the front-surface wiring portion K114. The lead 2M is electrically connected to the front-surface wiring portion K115. The lead 2N is electrically connected to the front-surface wiring portion K116. The lead 2P is electrically connected to the front-surface wiring portion K117. The lead 2Q is electrically connected to the front-surface wiring portion K119. The lead 2R is electrically connected to the front-surface wiring portion K11i.

As shown in FIG. 4, the leads 2S, 2T, and 2U are connected to the plurality of through portions K398. As such, the lead 2S is electrically connected to the second portion K152. The lead 2T is electrically connected to the back-surface wiring portion K222. The lead 2U is electrically connected to the back-surface wiring portion K221.

As shown in FIG. 7, the power converter A1 includes a conductive path D1 that electrically connects the lead 2I and the connecting terminal T1. The conductive path D1 corresponds to a first conductive path of the present disclosure. In the illustrated example, the conductive path D1 is composed of, starting from the lead 2I side, solder K49, a pad portion K296, a through portion K396, the front-surface wiring portion K111, a through portion K31, the back-surface wiring portion K211, a through portion K32, the resistor R21, the front-surface wiring portion K11a, a through portion K391, a pad portion K291, and the solder K49. As can be understood from FIG. 4, the conductive path D1 is shaped along the y direction.

Also, as shown in FIG. 4, the power converter A1 includes a plurality of conductive paths D1 as described below, which are similar to the conductive path D1 described with reference to FIG. 7. That is, one of the conductive paths D1 is composed of the solder K49, a pad portion K296, a through portion K396, the front-surface wiring portion K112, a through portion K31, the back-surface wiring portion K212, a through portion K32, the resistor R22, the front-surface wiring portion K11b, a through portion K391, a pad portion K291, and the solder K49. Another one of the conductive paths D1 is composed of the solder K49, a pad portion K296, a through portion K396, the front-surface wiring portion K113, a through portion K31, the back-surface wiring portion K213, a through portion K32, the resistor R23, the front-surface wiring portion K11c, a through portion K391, a pad portion K291, and the solder K49. Another one of the conductive paths D1 is composed of the solder K49, a pad portion K296, a through portion K396, the front-surface wiring portion K114, a through portion K31, the back-surface wiring portion K214, a through portion K32, the resistor R24, the front-surface wiring portion K11d, a through portion K391, a pad portion K291, and the solder K49. Another one of the conductive paths D1 is composed of the solder K49, a pad portion K296, a through portion K396, the front-surface wiring portion K115, a through portion K31, the back-surface wiring portion K215, a through portion K32, the resistor R25, the front-surface wiring portion K11e, a through portion K391, a pad portion K291, and the solder K49. Another one of the conductive paths D1 is composed of the solder K49, a pad portion K296, a through portion K396, the front-surface wiring portion K116, a through portion K31, the back-surface wiring portion K216, a through portion K32, the resistor R26, the front-surface wiring portion K11f, a through portion K391, a pad portion K291, and the solder K49. Another one of the conductive paths D1 is composed of the solder K49, a pad portion K296, a through portion K396, the front-surface wiring portion K118, a through portion K391, a pad portion K291, and the solder K49. Another one of the conductive paths D1 is composed of the solder K49, a pad portion K296, a through portion K396, the front-surface wiring portion K119, a through portion K391, a pad portion K291, and the solder K49.

These conductive paths D1 are shaped along the y direction and aligned in the x direction.

The front-surface wiring portions K111, K112, K113, K114, K115, and K116 each correspond to the first front-surface wiring portion of the present disclosure. The back-surface wiring portions K211, K212, K213, K214, K215, and K216 each correspond to the first back-surface wiring portion of the present disclosure. The through portions K31 each correspond to the first through portion of the present disclosure. The resistor R21, R22, R23, R24, R25, and R26 each correspond to a first resistor of the present disclosure.

As shown in FIG. 9, the power converter A1 includes a conductive path D2 that electrically connects the lead 1B and the connecting terminal T5. The conductive path D2 corresponds to a second conductive path of the present disclosure. In the illustrated example, the conductive path D2 is composed of, starting from the lead 1B side, the solder K49, a pad portion K29a, a through portion K39a, the front-surface wiring portion K171, a plurality of through portions K34, the back-surface wiring portion K231, a through portion K395, a pad portion K295, and the solder K49. As can be understood from FIG. 5, the conductive path D2 is shaped along the y direction. However, the present disclosure is not limited to this.

Also, as shown in FIG. 5, the power converter A1 includes a plurality of conductive paths D2 as described below, which are similar to the conductive path D2 described with reference to FIG. 9. That is, one of the conductive paths D2 is composed of the solder K49, a pad portion K29a, a through portion K39a, the front-surface wiring portion K172, a plurality of through portions K34, the back-surface wiring portion K232, a through portion K395, a pad portion K295, and the solder K49. Another one of the conductive paths D2 is composed of the solder K49, a pad portion K29a, a through portion K39a, the front-surface wiring portion K173, a plurality of through portions K34, the back-surface wiring portion K233, a through portion K395, a pad portion K295, and the solder K49.

These conductive paths D2 are shaped along the y direction and aligned in the x direction. However, the shape of each conductive path D2 is not particularly limited.

The front-surface wiring portions K171, K172, and K173 each correspond to the third front-surface wiring portion of the present disclosure. The back-surface wiring portions K231, K232, and K233 each correspond to the second back-surface wiring portion of the present disclosure. The through portions K34 each correspond to the second through portion of the present disclosure.

Descriptions of the semiconductor device B1 will now be described with reference to FIGS. 10 to 17. The semiconductor device B1 includes a plurality of leads 1, a plurality of leads 2, a substrate 3, a plurality of semiconductor chips 4, a diode 41, a plurality of control chips 4, a transmission circuit chip 4I, a primary circuit chip 4J, a plurality of diodes 49, a conductive portion 5, a plurality of bonding portions 6, a plurality of first wires 91, a plurality of second wires 92, a plurality of third wires 93, a plurality of fourth wires 94, a plurality of fifth wires 95, a plurality of sixth wires 96, a plurality of seventh wires 97, and a sealing resin 7.

Figure 10:
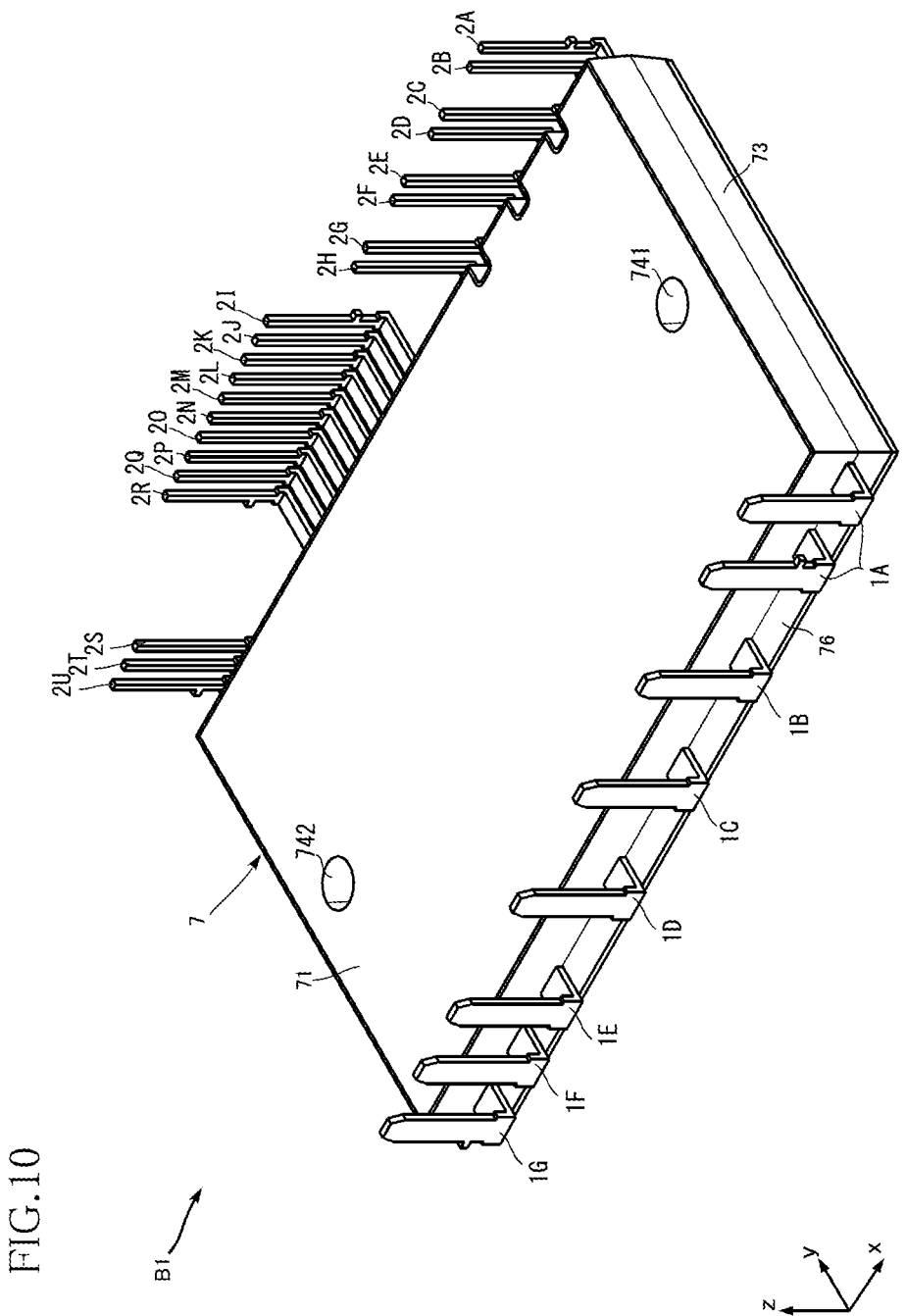
FIG. 10 is a perspective view showing a semiconductor device according to the first embodiment of the present disclosure.
Figure 11:
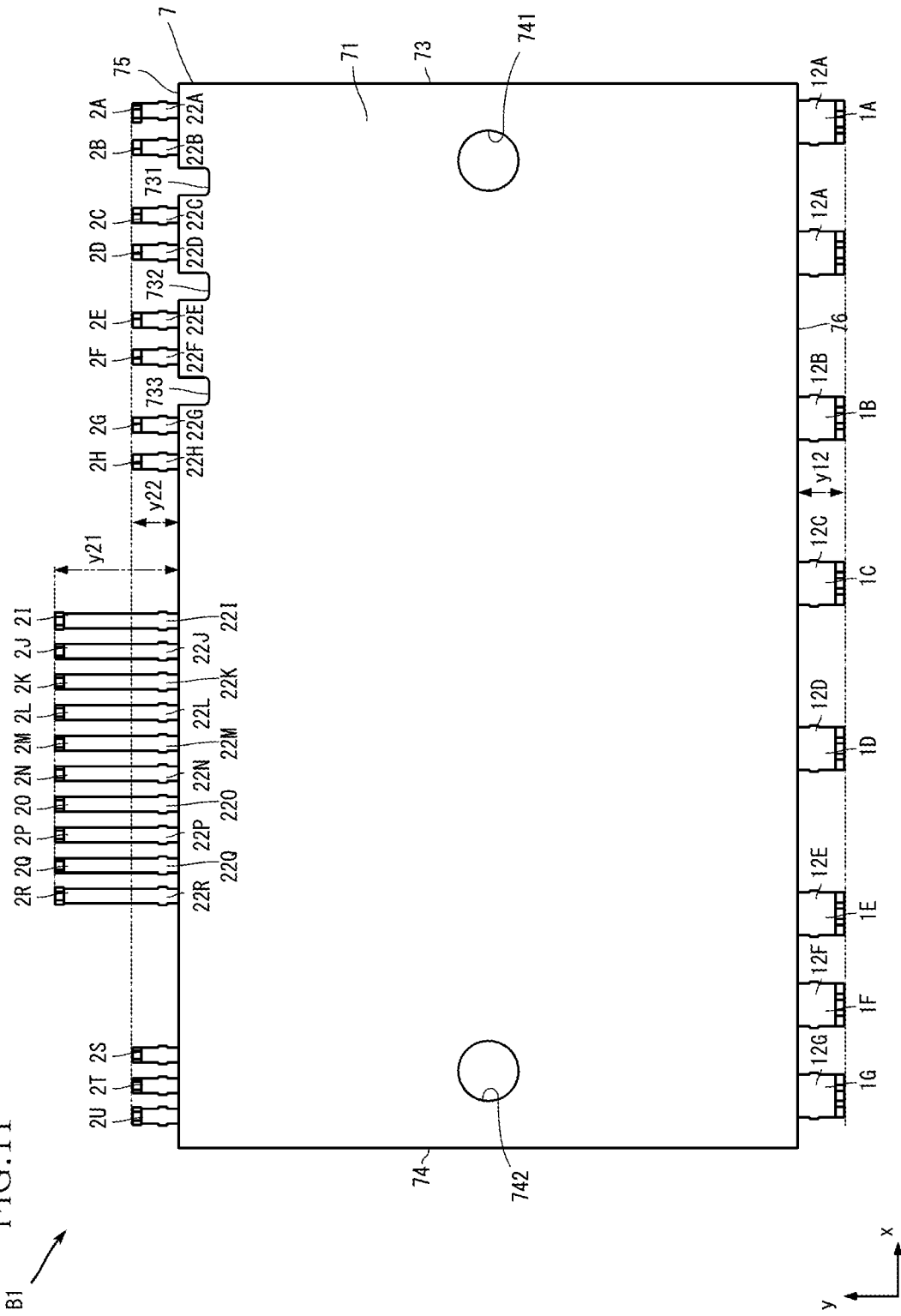
FIG. 11 is a plan view showing the semiconductor device according to the first embodiment of the present disclosure.
Figure 12:
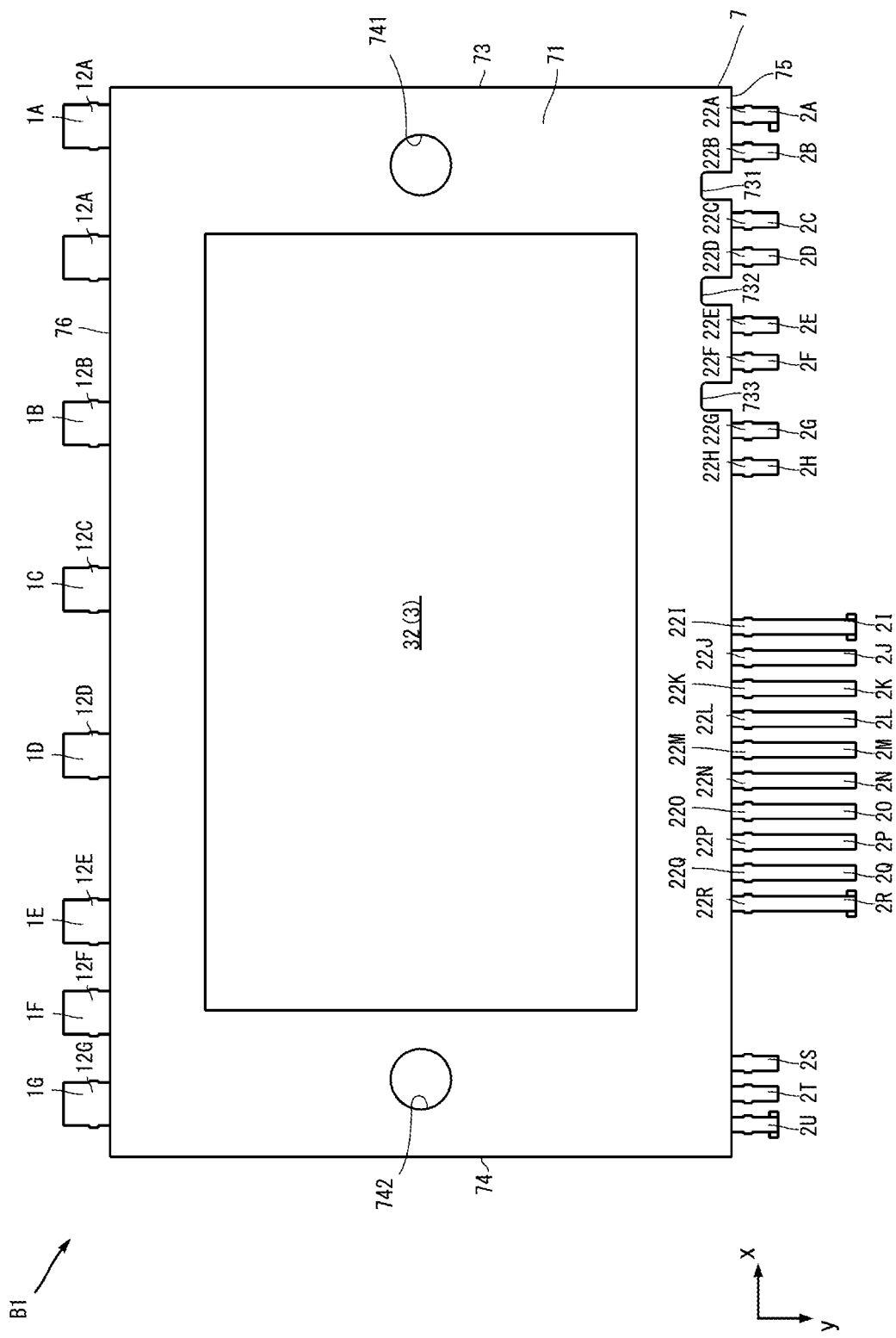
FIG. 12 is a bottom view showing the semiconductor device according to the first embodiment of the present disclosure.
Figure 13:
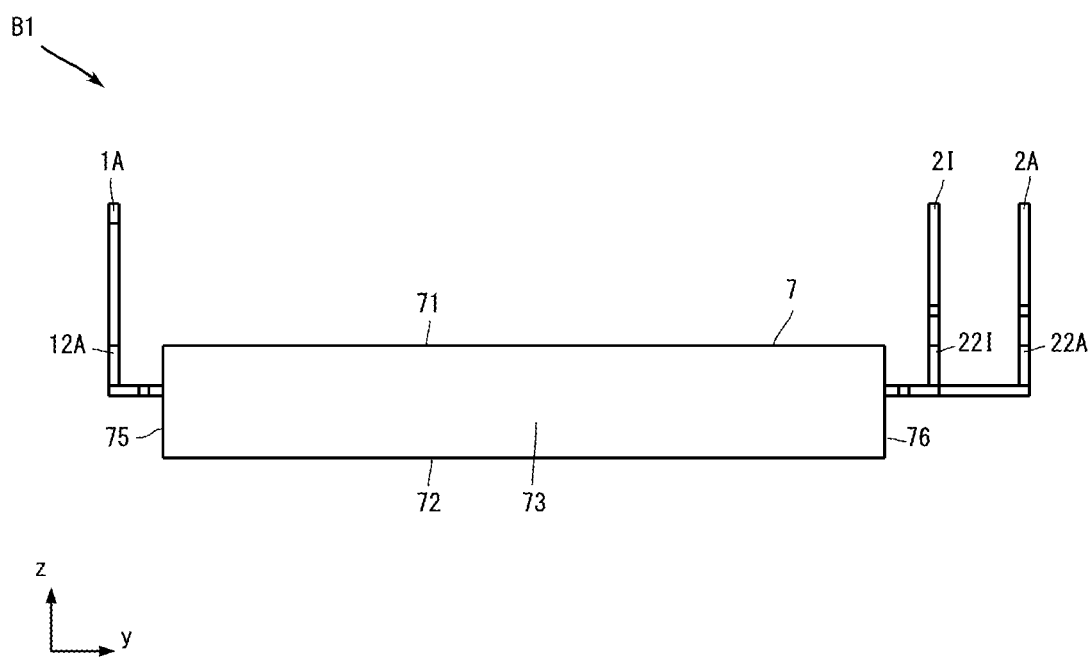
FIG. 13 is a side view showing the semiconductor device according to the first embodiment of the present disclosure.
Figure 14:
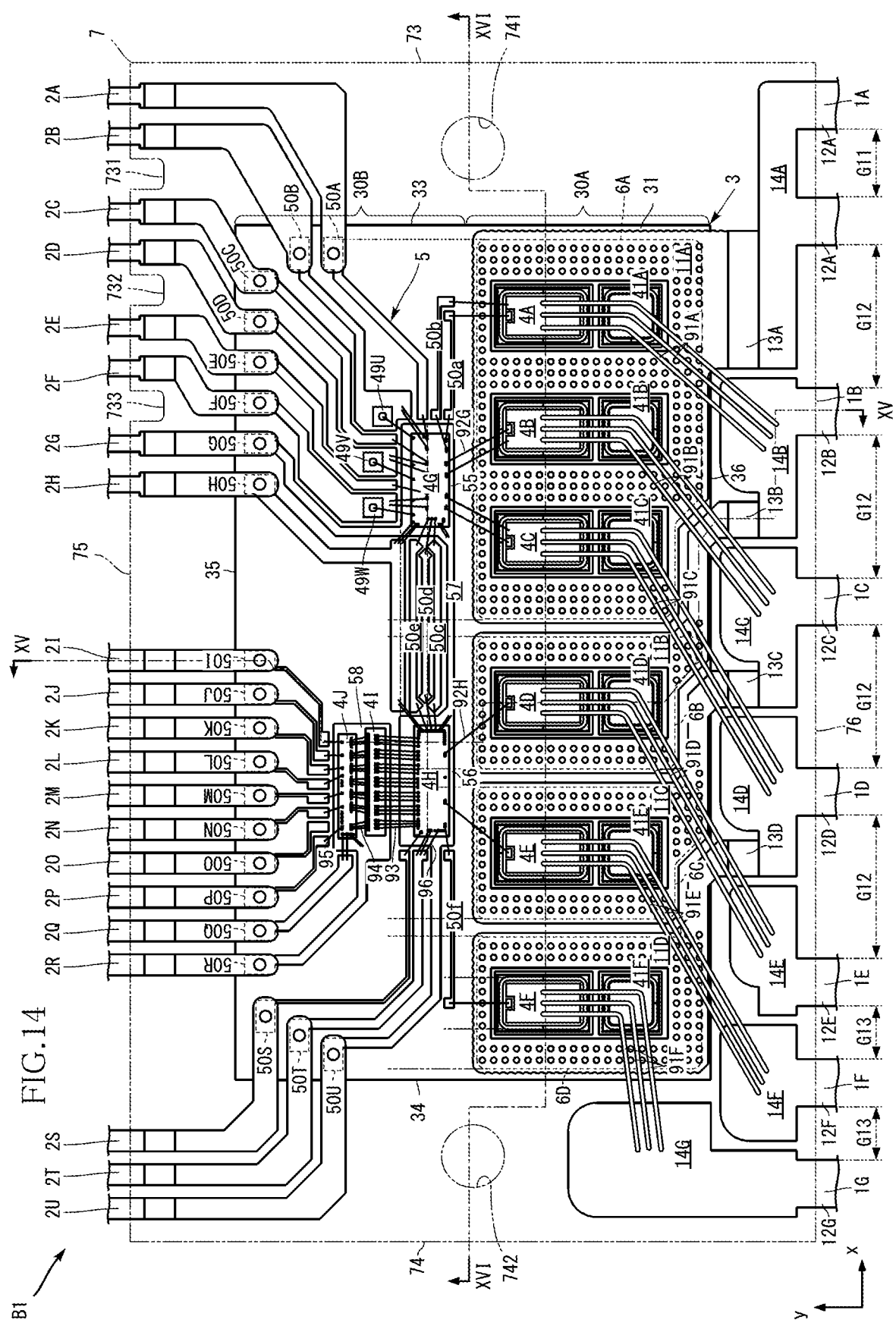
FIG. 14 is a main-part plan view showing the semiconductor device according to the first embodiment of the present disclosure.
Figure 15:
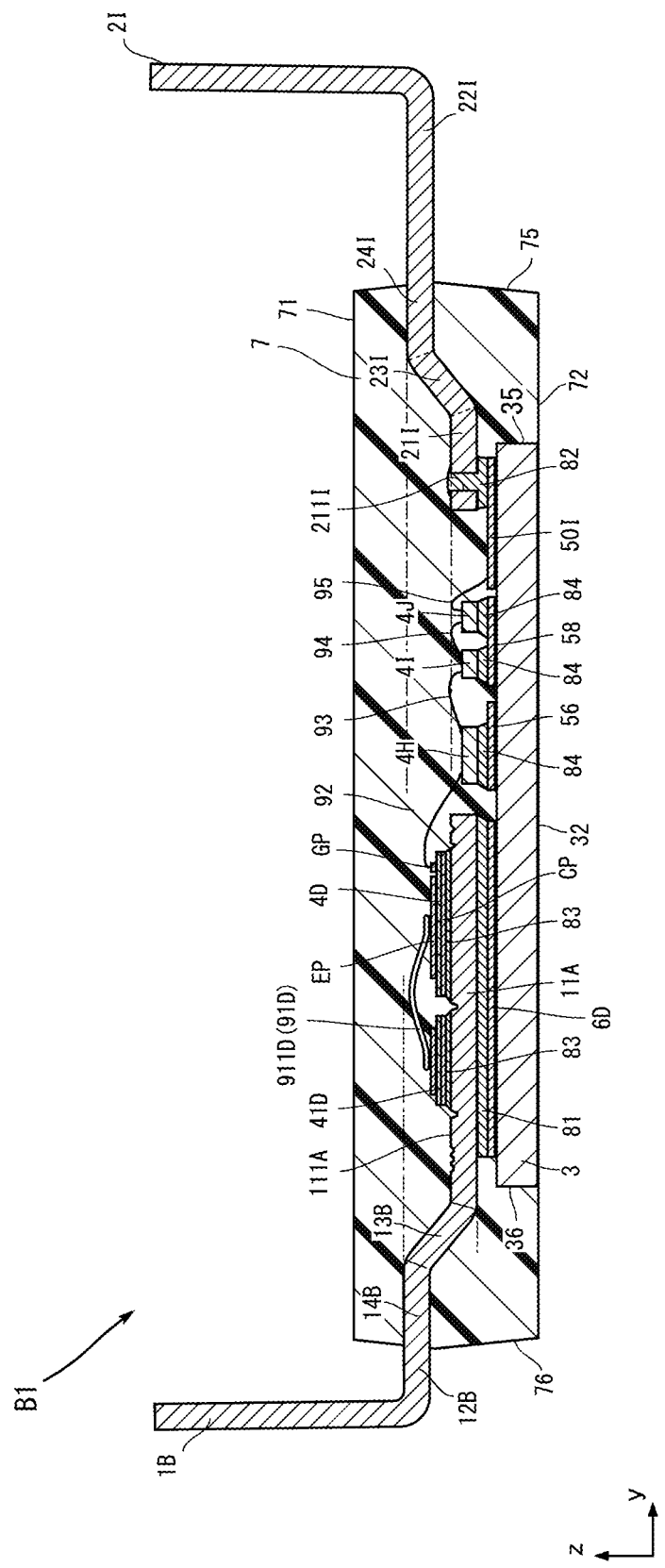
FIG. 15 is a cross-sectional view along line XV-XV of FIG. 14.
Figure 16:
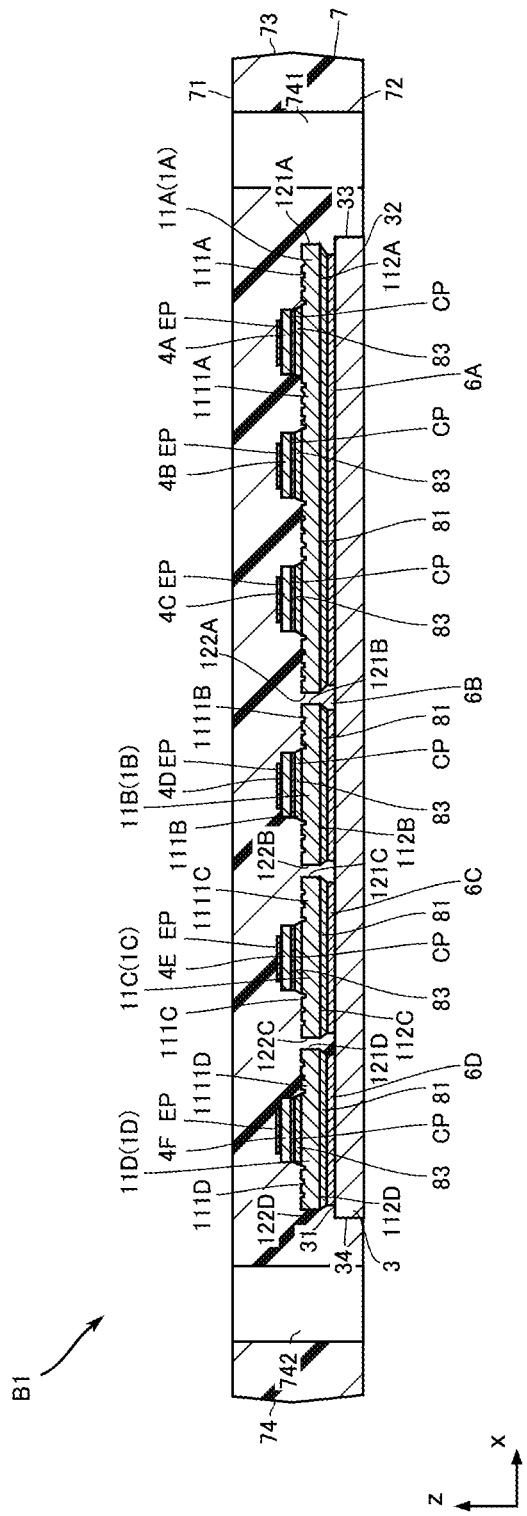
FIG. 16 is a cross-sectional view along line XVI-XVI of FIG. 14.
Figure 17:
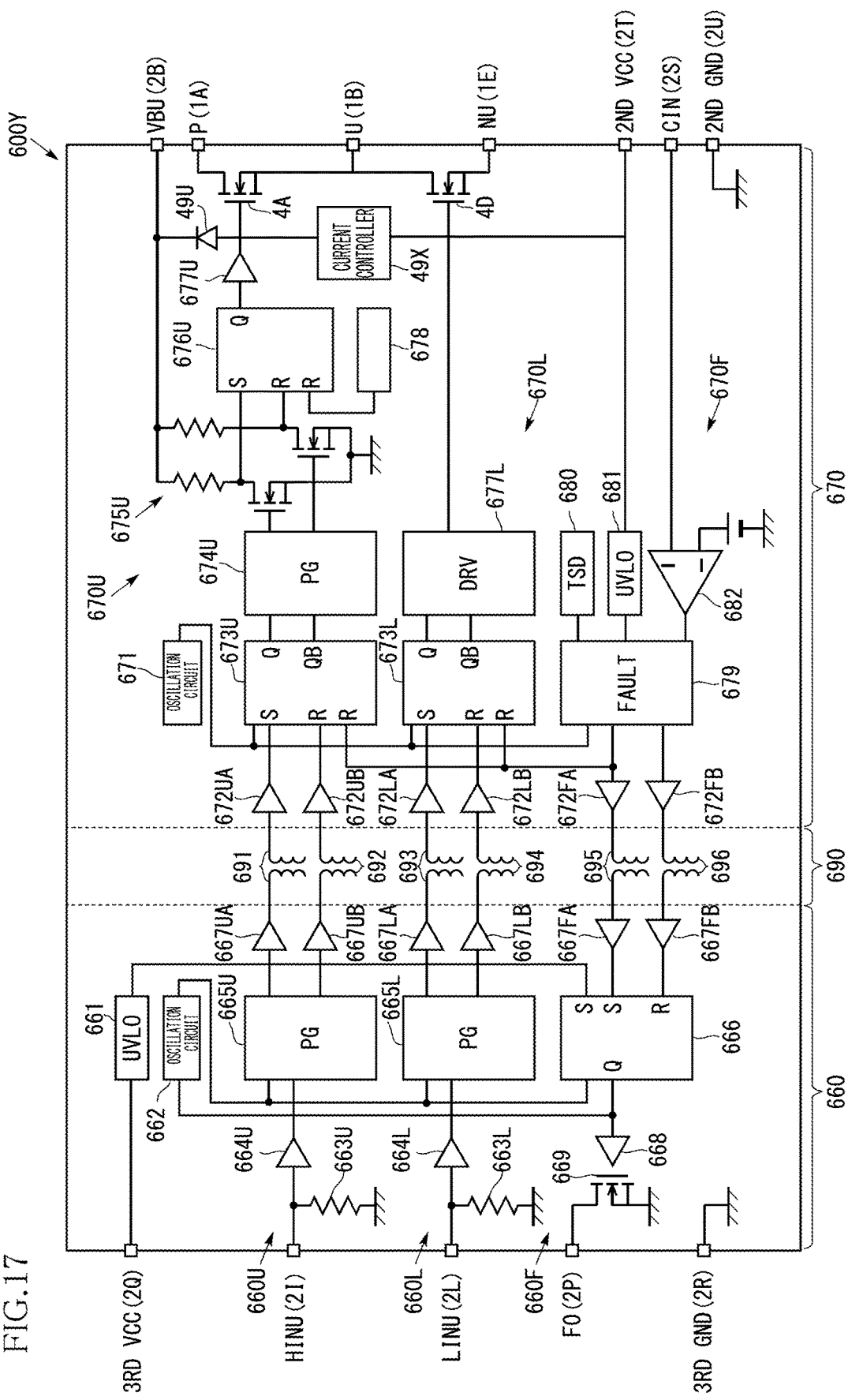
FIG. 17 is a circuit diagram schematically showing the electrical configuration of the semiconductor device according to the first embodiment of the present disclosure.

FIG. 10 is a perspective view showing the semiconductor device B1. FIG. 11 is a plan view showing the semiconductor device B1. FIG. 12 is a bottom view showing the semiconductor device B1. FIG. 13 is a side view showing the semiconductor device B1. FIG. 14 is a main-part plan view showing the semiconductor device B1. FIG. 15 is a cross-sectional view along line XV-XV of FIG. 14. FIG. 16 is a cross-sectional view along line XVI-XVI of FIG. 14. FIG. 17 is a circuit diagram schematically showing the electrical configuration of the semiconductor device B1.

<Substrate 3>

The material of the substrate 3 is not particularly limited. For example, it is preferable that the substrate 3 be made of a material having a higher thermal conductivity than the material of the resin 7. Examples of the material of the substrate 3 include ceramics such as alumina ($Al_2O_3$) silicon nitride (SiN), aluminum nitride (AlN), and zirconia-containing alumina. The thickness of the substrate 3 is not particularly limited, and is approximately 0.1 mm to 1.0 mm, for example. The substrate 3 corresponds to a second substrate of the present disclosure.

The shape of the substrate 3 is not particularly limited. As shown in FIGS. 14 to 16, in the present embodiment, the substrate 3 has a first surface 31, a second surface 32, a third surface 33, a fourth surface 34, a fifth surface 35, and a sixth surface 36. The first surface 31 faces in the z direction. The second surface 32 faces opposite to the first surface 31 in the z direction. The third surface 33 is positioned between the first surface 31 and the second surface 32 in the z direction. In the illustrated example, the third surface 33 is connected to the first surface 31 and the second surface 32. The third surface 33 faces in the x direction. The fourth surface 34 is positioned between the first surface 31 and the second surface 32 in the z direction. In the illustrated example, the fourth surface 34 is connected to the first surface 31 and the second surface 32. The fourth surface 34 faces opposite to the third surface 33 in the x direction. The fifth surface 35 is positioned between the first surface 31 and the second surface 32 in the z direction. In the illustrated example, the fifth surface 35 is connected to the first surface 31 and the second surface 32. The fifth surface 35 faces in the y direction. The sixth surface 36 is positioned between the first surface 31 and the second surface 32 in the z direction. In the illustrated example, the sixth surface 36 is connected to the first surface 31 and the second surface 32. The sixth surface 36 faces opposite to the fifth surface 35 in the y direction. In the illustrated example, the substrate 3 has a rectangular shape as viewed in the z direction. Specifically, the substrate 3 has a long rectangular shape elongated in the x direction as viewed in the z direction.

<Conductive Portion 5>

The conductive portion 5 is formed on the substrate 3. In the present embodiment, the conductive portion 5 is formed on the first surface 31 of the substrate 3. The conductive portion 5 is made of a conductive material. The conductive material of the conductive portion 5 is not particularly limited. The conductive material of the conductive portion 5 may contain silver (Ag), copper (Cu), or gold (Au). In the following description, the conductive portion 5 containing silver is taken as an example. The conductive portion 5 may contain copper instead of silver, or may contain gold instead of silver or copper. Alternatively, the conductive portion 5 may contain Ag—Pt or Ag—Pd. The conductive portion 5 may be formed by various forming methods. For example, the conductive portion 5 is formed by baking a paste containing any of the metals mentioned above. The thickness of the conductive portion 5 is not particularly limited, and is approximately 5 μm to 30 μm. The conductive portion 5 corresponds to a second conductive portion of the present disclosure.

As shown in FIG. 14, in the present embodiment, the conductive portion 5 includes wiring portions 50A to 50U, wiring portions 50a to 50f, a first base member 55, a second base member 56, and a third base member 58, and descriptions of these portions are provided below.

The shape of the first base member 55 is not particularly limited and may be any appropriate shape selected from among a rectangular shape, a polygonal shape, a circular shape, an elliptical shape, and the like. In the illustrated example, the first base member 55 has a rectangular shape. Specifically, the first base member 55 has a long rectangular shape elongated in the x direction.

The shape of the second base member 56 is not particularly limited and may be any appropriate shape selected from among a rectangular shape, a polygonal shape, a circular shape, an elliptical shape, and the like. In the illustrated example, the second base member 56 has a rectangular shape. Specifically, the second base member 56 has a long rectangular shape elongated in the x direction.

A connecting portion 57 is interposed between the first base member 55 and the second base member 56, and connects the first base member 55 and the second base member 56 in the illustrated example. In the illustrated example, the connecting portion 57 is positioned between the first base member 55 and the second base member 56 as viewed in the y direction. The shape of the connecting portion 57 is not particularly limited.

The shape of the third base member 58 is not particularly limited and may be any appropriate shape selected from among a rectangular shape, a polygonal shape, a circular shape, an elliptical shape, and the like. Specifically, in the illustrated example, the third base member 58 has two sides along the x direction and two sides along the y direction, and has a shape elongated in the x direction.

The wiring portions 50A to 50U and the wiring portions 50a to 50f are arranged apart from each other. The wiring portions 50A to 50U and the wiring portions 50a to 50f each have a bent strip shape.

<Bonding Portions 6>

The plurality of bonding portions 6 are formed on the substrate 3. In the present embodiment, the plurality of bonding portions 6 are formed on the first surface 31 of the substrate 3. The bonding portions 6 are made of a conductive material, for example. The conductive material of the bonding portions 6 is not particularly limited. The conductive material of the bonding portions 6 may include silver (Ag), copper (Cu), or gold (Au). In the following description, the bonding portions 6 containing silver are taken as an example. The bonding portions 6 in this example have the same conductive material as the conductive portion 5. Note that the bonding portions 6 may contain copper instead of silver, or may contain gold instead of silver or copper. Alternatively, the conductive portion 5 may contain Ag—Pt or Ag—Pd. The bonding portions 6 may be formed by various forming methods. For example, the bonding portions 6 are formed by baking a paste containing any of the metals mentioned above, as with the case of the conductive portion 5. The thickness of the bonding portions 6 is not particularly limited, and is approximately 5 μm to 30 μm.

As shown in FIG. 14, in the present embodiment, the plurality of bonding portions 6 include bonding portions 6A to 6D.

As shown in FIGS. 14 and 16, the bonding portion 6A is arranged closer to the sixth surface 36 than the conductive portion 5 in the y direction. The bonding portion 6A overlaps with the entirety of the first base member 55 as viewed in the y direction. The shape of the bonding portion 6A is not particularly limited.

As shown in FIGS. 14 and 16, the bonding portion 6B is arranged closer to the sixth surface 36 than the conductive portion 5 in they direction. The bonding portion 6B is arranged closer to the fourth surface 34 than the bonding portion 6A in the x direction. In the illustrated example, the bonding portion 6B overlaps with the connecting portion 57, the wiring portions 50c to 50e, and the second base member 56, as viewed in the y direction. The shape of the bonding portion 6B is not particularly limited.

As shown in FIGS. 14 and 16, the bonding portion 6C is arranged closer to the sixth surface 36 than the conductive portion 5 in they direction. The bonding portion 6C is arranged closer to the fourth surface 34 than the bonding portion 6B in the x direction. In the illustrated example, the bonding portion 6C overlaps with the wiring portions 50S to 50U, the wiring portion 50f, and the second base member 56, as viewed in the y direction. The shape of the bonding portion 6C is not particularly limited.

As shown in FIGS. 14 and 16, the bonding portion 6D is arranged closer to the sixth surface 36 than the conductive portion 5 in they direction. The bonding portion 6D is arranged closer to the fourth surface 34 than the bonding portion 6C in the x direction. In the illustrated example, the bonding portion 6D overlaps with the wiring portions 50S to 50U and the wiring portion 50f, as viewed in the y direction. The bonding portion 6D is spaced apart from the second base member 56. The shape of the bonding portion 6D is not particularly limited.

<Lead 1>

The plurality of leads 1 contain a metal and have a higher heat dissipation property than the substrate 3. The metal contained in the leads 1 is not particularly limited, and may be copper (Cu), aluminum, iron (Fe), oxygen-free copper, or an alloy of these metals (e.g., a Cu—Sn alloy, a Cu—Zr alloy, or a Cu—Fe alloy). The plurality of leads 1 may be plated with nickel (Ni). The plurality of leads 1 may be formed by, but not limited to, pressing a die against a metal plate, or patterning a metal plate through etching. The thickness of the leads 1 is not particularly limited, and is approximately 0.4 mm to 0.8 mm.

As shown in FIGS. 10 to 16, the plurality of leads 1 include leads 1A to 1G. The leads 1A to 1G constitute conductive paths to the semiconductor chips 4A to 4F.

The lead 1A is arranged on the substrate 3. In the present embodiment, the lead 1A is arranged on the first surface 31. The lead 1A is an example of a first lead of the present disclosure. The lead 1A is bonded to the bonding portion 6A via a bonding material 81. The bonding material 81 preferably has high thermal conductivity, and may be a silver paste, a copper paste, solder, or the like. However, the bonding material 81 may be an insulating material such as an epoxy resin or a silicone resin. If the bonding portion 6A is not formed on the substrate 3, the lead 1A may be bonded to the substrate 3.

The structure of the lead 1A is not particularly limited. In the present embodiment, the lead 1A includes a first portion 11A, a second portion 12A, a third portion 13A, and a fourth portion 14A, and descriptions of these portions are provided below.

As shown in FIG. 16, the first portion 11A is bonded to the bonding portion 6A with the bonding material 81.

The third portion 13A and the fourth portion 14A are covered with the sealing resin 7. The third portion 13A is connected to the first portion 11A and the fourth portion 14A. In the illustrated example, the third portion 13A is connected to a portion of the first portion 11A that is adjacent to a fourth surface 124A. The third portion 13A is spaced apart from the sixth surface 36 as viewed in the z direction. Similarly to a third portion 13B and a fourth portion 14B shown in FIG. 15, the fourth portion 14A is shifted further in the z direction than the first portion 11A to the side which a front surface 111A faces. The boundary of the fourth portion 14A is flush with a sixth surface 76 of the resin 7.

The second portion 12A is a portion of the lead 1A that is connected to the end of the fourth portion 14A, and that protrudes from the sealing resin 7. The second portion 12A protrudes to the side opposite to the first portion 11A in the y direction. The second portion 12A is used to electrically connect the semiconductor device B1 to an external circuit, for example. In the illustrated example, the second portion 12A is bent to the side the front surface 111A faces in the z direction. In the present embodiment, the lead 1A has two second portions 12A. The two second portions 12A are arranged apart from each other in the x direction.

The lead 1B is arranged on the substrate 3. In the present embodiment, the lead 1B is arranged on the first surface 31. The lead 1B is an example of the first lead of the present disclosure. The lead 1B is bonded to the bonding portion 6B via the bonding material 81 described above. If the bonding portion 6B is not formed on the substrate 3, the lead 1B may be connected to the substrate 3.

The structure of the lead 1B is not particularly limited. In the present embodiment, the lead 1B includes a first portion 11B, a second portion 12B, the third portion 13B, and the fourth portion 14B, and descriptions of these portions are provided below.

The first portion 11B is bonded to the bonding portion 6B with the bonding material 81.

The third portion 13B and the fourth portion 14B are covered with the sealing resin 7. The third portion 13B is connected to the first portion 11B and the fourth portion 14B. In the illustrated example, the third portion 13B is connected to a portion of the first portion 11B that is adjacent to a fourth surface 124B. The third portion 13B overlaps with the sixth surface 36 as viewed in the z direction. The fourth portion 14B is shifted further in the z direction than the first portion 11B to the side which a front surface 111B faces. An end of the fourth portion 14B is flush with the sixth surface 76 of the resin 7.

The second portion 12B is a portion of the lead 1B which is connected to the fourth portion 14B, and that protrudes from the sealing resin 7. The second portion 12B protrudes to the side opposite to the first portion 11B in the y direction. The second portion 12B is used to electrically connect the semiconductor device B1 to an external circuit, for example. In the illustrated example, the second portion 12B is bent to the side the front surface 111B faces in the z direction.

The lead 1C is arranged on the substrate 3. In the present embodiment, the lead 1C is arranged on the first surface 31. The lead 1C is an example of the first lead of the present disclosure. The lead 1C is bonded to the bonding portion 6C via the bonding material 81 described above. If the bonding portion 6C is not formed on the substrate 3, the lead 1C may be connected to the substrate 3.

The structure of the lead 1C is not particularly limited. In the present embodiment, the lead 1C includes a first portion 11C, a second portion 12C, a third portion 13C, and a fourth portion 14C, and descriptions of these portions are provided below.

The first portion 11C is bonded to the bonding portion 6C with the bonding material 81.

The third portion 13C and the fourth portion 14C are covered with the sealing resin 7. The third portion 13C is connected to the first portion 11C and the fourth portion 14C. In the illustrated example, the third portion 13C is connected to a portion of the first portion 11C that is adjacent to a fourth surface 124C. Similarly to the fourth portion 14B of the lead 1B, the fourth portion 14C is shifted further in the z direction than the first portion 11C to the side which a front surface 111C faces. An end of the fourth portion 14C is flush with the sixth surface 76 of the resin 7.

The second portion 12C is a portion of the lead 1C that is connected to the end of the fourth portion 14C, and that protrudes from the sealing resin 7. The second portion 12C protrudes to the side opposite to the first portion 11C in the y direction. The second portion 12C is used to electrically connect the semiconductor device B1 to an external circuit, for example. In the illustrated example, the second portion 12C is bent to the side the front surface 111C faces in the z direction.

The lead 1D is arranged on the substrate 3. In the present embodiment, the lead 1D is arranged on the first surface 31. The lead 1D is an example of the first lead of the present disclosure. The lead 1D is bonded to the bonding portion 6D via the bonding material 81 described above. If the bonding portion 6D is not formed on the substrate 3, the lead 1D may be connected to the substrate 3.

The structure of the lead 1D is not particularly limited. In the present embodiment, the lead 1D includes a first portion 11D, a second portion 12D, a third portion 13D, and a fourth portion 14D, and descriptions of these portions are provided below.

The first portion 11D is bonded to the bonding portion 6D with the bonding material 81.

The third portion 13D and the fourth portion 14D are covered with the sealing resin 7. The third portion 13D is connected to the first portion 11D and the fourth portion 14D. In the illustrated example, the third portion 13D is connected to a portion of the first portion 11D that is adjacent to a fourth surface 124D. Similarly to the fourth portion 14B of the lead 1B, the fourth portion 14D is shifted further in the z direction than the first portion 11D to the side which a front surface 111D faces. An end of the fourth portion 14D is flush with the sixth surface 76 of the resin 7.

The second portion 12D is a portion of the lead 1D that is connected to the end of the fourth portion 14D, and that protrudes from the sealing resin 7. The second portion 12D protrudes to the side opposite to the first portion 11D in the y direction. The second portion 12D is used to electrically connect the semiconductor device B1 to an external circuit, for example. In the illustrated example, the second portion 12D is bent to the side the front surface 111D faces in the z direction.

The lead 1E is spaced apart from the substrate 3 as viewed in the z direction. In the present embodiment, the lead 1E is arranged further in the y direction than the substrate 3 to the side which the sixth surface 36 faces.

The structure of the lead 1E is not particularly limited. In the present embodiment, the lead 1E includes a second portion 12E and a fourth portion 14E, as shown in FIG. 4, and descriptions of these portions are provided below.

The fourth portion 14E is covered with the sealing resin 7. Similarly to the fourth portion 14D of the lead 1D, the fourth portion 14E is shifted further in the z direction than the first portion 11D to the side which the front surface 111D faces. The fourth portion 14E overlaps with the first portion 11C and the first portion 11D as viewed in the y direction. An end of the fourth portion 14E is flush with the sixth surface 76 of the resin 7.

The second portion 12E is a portion of the lead 1E that is connected to the end of the fourth portion 14E, and that protrudes from the sealing resin 7. The second portion 12E protrudes to the side opposite to the fourth portion 14E in they direction. The second portion 12E is used to electrically connect the semiconductor device B1 to an external circuit, for example. In the illustrated example, the second portion 12E is bent to the side the first surface 31 faces in the z direction.

The lead 1F is spaced apart from the substrate 3 as viewed in the z direction. In the present embodiment, the lead 1F is arranged offset in the y direction from the substrate 3 to the side which the sixth surface 36 faces. The lead 1F is arranged opposite to the fourth portion 14D with the lead 1E therebetween in the x direction.

The structure of the lead 1F is not particularly limited. In the present embodiment, the lead 1F includes a second portion 12F and a fourth portion 14F, as shown in FIG. 4, and descriptions of these portions are provided below.

The fourth portion 14F is covered with the sealing resin 7. Similarly to the fourth portion 14D of the lead 1D, the fourth portion 14F is shifted further in the z direction than the first portion 11D to the side which the front surface 111D faces. The fourth portion 14F overlaps with the first portion 11D as viewed in the y direction. An end of the fourth portion 14F is flush with the sixth surface 76 of the resin 7.

The second portion 12F is a portion of the lead 1F that is connected to the end of the fourth portion 14F, and that protrudes from the sealing resin 7. The second portion 12F protrudes to the side opposite to the fourth portion 14F in the y direction. The second portion 12F is used to electrically connect the semiconductor device B1 to an external circuit, for example. In the illustrated example, the second portion 12F is bent to the side the first surface 31 faces in the z direction.

The lead 1G is spaced apart from the substrate 3 as viewed in the z direction. In the present embodiment, the lead 1G is arranged further in the x direction than the substrate 3 to the side which the fourth surface 34 faces. The lead 1G is arranged opposite to the fourth portion 14E with the lead 1F therebetween in the x direction.

The structure of the lead 1G is not particularly limited. In the present embodiment, the lead 1G includes a second portion 12G and a fourth portion 14G, as shown in FIG. 4, and descriptions of these portions are provided below.

The fourth portion 14G is covered with the sealing resin 7. Similarly to the fourth portion 14D of the lead 1D, the fourth portion 14G is shifted further in the z direction than the first portion 11D to the side which the front surface 111D faces. The fourth portion 14G overlaps with the fourth portion 14F as viewed in they direction. The fourth portion 14G overlaps with the first portion 11D as viewed in the z direction. An end of the fourth portion 14G is flush with the sixth surface 76 of the resin 7.

The second portion 12G is a portion of the lead 1G which is connected to the fourth portion 14G, and that protrudes from the sealing resin 7. The second portion 12G protrudes to the side opposite to the fourth portion 14G in the y direction. The second portion 12G is used to electrically connect the semiconductor device B1 to an external circuit, for example. In the illustrated example, the second portion 12G is bent to the side the first surface 31 faces in the z direction.

As shown in FIG. 14, two second portions 12A are arranged apart from each other with a gap G11 therebetween as viewed in the x direction. The second portions 12A to 12E are arranged apart from each other with gaps G12 in the x direction.

<Lead 2>

The plurality of leads 2 contain a metal and have a higher heat dissipation property than the substrate 3. The metal contained in the leads 2 is not particularly limited, and may be copper (Cu), aluminum, iron (Fe), oxygen-free copper, or an alloy of these metals (e.g., a Cu—Sn alloy, a Cu—Zr alloy, or a Cu—Fe alloy). The plurality of leads 2 may be plated with nickel (Ni). The plurality of leads 2 may be formed by, but not limited to, pressing a die against a metal plate, or patterning a metal plate through etching. The thickness of the leads 2 is not particularly limited, and is approximately 0.4 mm to 0.8 mm. The plurality of leads 2 are arranged such as to overlap with a second region 30B of the substrate 3 as viewed in the z direction.

In the present embodiment, the plurality of leads 2 include a plurality of leads 2A to 2U, as shown in FIGS. 10 to 15. The plurality of leads 2A to 2H, and 2S to 2U constitute the conductive paths to the control chips 4G and 4H. The plurality of leads 2I to 2R constitute the conductive path to the primary circuit chip 4J.

The lead 2A is spaced apart from the plurality of leads 1. The lead 2A is arranged on the conductive portion 5. The lead 2A is electrically connected to the conductive portion 5. The lead 2A is an example of a second lead of the present disclosure. The lead 2A is bonded to the wiring portion 50A of the conductive portion 5 via a conductive bonding material 82. It suffices for the conductive bonding material 82 to be capable of bonding and electrically connecting the lead 2A to the wiring portion 50A. The conductive bonding material 82 may be a silver paste, a copper paste, or solder. The conductive bonding material 82 corresponds to a first conductive bonding material of the present disclosure.

The lead 2B is spaced apart from the plurality of leads 1. The lead 2B is arranged on the conductive portion 5. The lead 2B is electrically connected to the conductive portion 5. The lead 2B is an example of the second lead of the present disclosure. The lead 2B is bonded to the wiring portion 50B of the conductive portion 5 with the conductive bonding material 82.

The lead 2C is spaced apart from the plurality of leads 1. The lead 2C is arranged on the conductive portion 5. The lead 2C is electrically connected to the conductive portion 5. The lead 2C is an example of the second lead of the present disclosure. The lead 2C is bonded to the wiring portion 50C of the conductive portion 5 with the conductive bonding material 82.

The lead 2D is spaced apart from the plurality of leads 1. The lead 2D is arranged on the conductive portion 5. The lead 2D is electrically connected to the conductive portion 5. The lead 2D is an example of the second lead of the present disclosure. The lead 2D is bonded to the wiring portion 50D of the conductive portion 5 with the conductive bonding material 82.

The lead 2E is spaced apart from the plurality of leads 1. The lead 2E is arranged on the conductive portion 5. The lead 2E is electrically connected to the conductive portion 5. The lead 2E is an example of the second lead of the present disclosure. The lead 2E is bonded to the wiring portion 50E of the conductive portion 5 with the conductive bonding material 82.

The lead 2F is spaced apart from the plurality of leads 1. The lead 2F is arranged on the conductive portion 5. The lead 2F is electrically connected to the conductive portion 5. The lead 2F is an example of the second lead of the present disclosure. The lead 2F is bonded to the wiring portion 50F of the conductive portion 5 with the conductive bonding material 82.

The lead 2G is spaced apart from the plurality of leads 1. The lead 2G is arranged on the conductive portion 5. The lead 2G is electrically connected to the conductive portion 5. The lead 2G is an example of the second lead of the present disclosure. The lead 2G is bonded to the wiring portion 50G of the conductive portion 5 with the conductive bonding material 82.

The lead 2H is spaced apart from the plurality of leads 1. The lead 2H is arranged on the conductive portion 5. The lead 2H is electrically connected to the conductive portion 5. The lead 2H is an example of the second lead of the present disclosure. The lead 2H is bonded to the wiring portion 50H of the conductive portion 5 with the conductive bonding material 82.

The lead 2I is spaced apart from the plurality of leads 1. The lead 2I is arranged on the conductive portion 5. The lead 2I is electrically connected to the conductive portion 5. The lead 2I is an example of the second lead of the present disclosure. The lead 2I is bonded to the wiring portion 50I of the conductive portion 5 with the conductive bonding material 82.

The lead 2J is spaced apart from the plurality of leads 1. The lead 2J is arranged on the conductive portion 5. The lead 2J is electrically connected to the conductive portion 5. The lead 2J is an example of the second lead of the present disclosure. The lead 2J is bonded to the wiring portion 50J of the conductive portion 5 with the conductive bonding material 82.

The lead 2K is spaced apart from the plurality of leads 1. The lead 2K is arranged on the conductive portion 5. The lead 2K is electrically connected to the conductive portion 5. The lead 2K is an example of the second lead of the present disclosure. The lead 2K is bonded to the wiring portion 50K of the conductive portion 5 with the conductive bonding material 82.

The lead 2L is spaced apart from the plurality of leads 1. The lead 2L is arranged on the conductive portion 5. The lead 2L is electrically connected to the conductive portion 5. The lead 2L is an example of the second lead of the present disclosure. The lead 2L is bonded to the wiring portion 50L of the conductive portion 5 with the conductive bonding material 82.

The lead 2M is spaced apart from the plurality of leads 1. The lead 2M is arranged on the conductive portion 5. The lead 2M is electrically connected to the conductive portion 5. The lead 2M is an example of the second lead of the present disclosure. The lead 2M is bonded to the wiring portion 50M of the conductive portion 5 with the conductive bonding material 82.

The lead 2N is spaced apart from the plurality of leads 1. The lead 2N is arranged on the conductive portion 5. The lead 2N is electrically connected to the conductive portion 5. The lead 2N is an example of the second lead of the present disclosure. The lead 2N is bonded to the wiring portion 50N of the conductive portion 5 with the conductive bonding material 82.

The lead 2O is spaced apart from the plurality of leads 1. The lead 2O is arranged on the conductive portion 5. The lead 2O is electrically connected to the conductive portion 5. The lead 2O is an example of the second lead of the present disclosure. The lead 2O is bonded to the wiring portion 50O of the conductive portion 5 with the conductive bonding material 82.

The lead 2P is spaced apart from the plurality of leads 1. The lead 2P is arranged on the conductive portion 5. The lead 2P is electrically connected to the conductive portion 5. The lead 2P is an example of the second lead of the present disclosure. The lead 2P is bonded to the wiring portion 50P of the conductive portion 5 with the conductive bonding material 82.

The lead 2Q is spaced apart from the plurality of leads 1. The lead 2Q is arranged on the conductive portion 5. The lead 2Q is electrically connected to the conductive portion 5. The lead 2Q is an example of the second lead of the present disclosure. The lead 2Q is bonded to the wiring portion 50Q of the conductive portion 5 with the conductive bonding material 82.

The lead 2R is spaced apart from the plurality of leads 1. The lead 2R is arranged on the conductive portion 5. The lead 2R is electrically connected to the conductive portion 5. The lead 2R is an example of the second lead of the present disclosure. The lead 2R is bonded to the wiring portion 50R of the conductive portion 5 with the conductive bonding material 82.

The lead 2S is spaced apart from the plurality of leads 1. The lead 2S is arranged on the conductive portion 5. The lead 2S is electrically connected to the conductive portion 5. The lead 2S is an example of the second lead of the present disclosure. The lead 2S is bonded to the wiring portion 50S of the conductive portion 5 with the conductive bonding material 82.

The lead 2T is spaced apart from the plurality of leads 1. The lead 2T is arranged on the conductive portion 5. The lead 2T is electrically connected to the conductive portion 5. The lead 2T is an example of the second lead of the present disclosure. The lead 2T is bonded to the wiring portion 50T of the conductive portion 5 with the conductive bonding material 82.

The lead 2U is spaced apart from the plurality of leads 1. The lead 2U is arranged on the conductive portion 5. The lead 2U is electrically connected to the conductive portion 5. The lead 2U is an example of the second lead of the present disclosure. The lead 2U is bonded to the wiring portion 50U of the conductive portion 5 with the conductive bonding material 82.

As shown in FIG. 11, in the present embodiment, dimensions y12 of the respective protrusions of the second portions 12A to 12G in the y direction from the sixth surface 76 are substantially the same. Dimensions y22 of the respective protrusions of second portions 22A to 22H and second portions 22S to 22U from a fifth surface 75 are substantially the same. Dimensions y21 of the respective protrusions of second portions 22I to 22R from the fifth surface 75 are substantially the same.

The dimensions y21 of the protrusions are larger than the dimensions y22 of the protrusions.

<Semiconductor Chips 4A-4F>

The semiconductor chips 4A to 4F, which are arranged on the plurality of leads 1, are examples of the semiconductor chips of the present disclosure. The type and functions of the semiconductor chips 4A to 4F are not particularly limited. In the present embodiment, descriptions are provided with an example where the semiconductor chips 4A to 4F are transistors.

Although the example shows the six semiconductor chips 4A to 4F, the number of semiconductor chips is not particularly limited. The semiconductor chips 4A to 4F constitute the secondary power circuit of the present disclosure. In the present embodiment, the semiconductor chips 4A to 4F are insulated gate bipolar transistors (IGBTs).

In the present embodiment, the three semiconductor chips 4A, 4B, and 4C are arranged on the first portion 11A of the lead 1A, as shown in FIGS. 14 to 16. The three semiconductor chips 4A, 4B, and 4C are spaced apart from each other in the x direction, and overlap with each other as viewed in the x direction. The number of semiconductor chips mounted on the lead 1A is not particularly limited. In the illustrated example, as viewed in the z direction, the gate electrodes GP of the semiconductor chips 4A, 4B, and 4C are positioned closer to the plurality of leads 2 than to the centers of the semiconductor chips 4A, 4B, and 4C in the y direction. In the illustrated example, collector electrodes CP of the semiconductor chips 4A, 4B, and 4C are bonded to the first portion 11A with a conductive bonding material 83.

It suffices for the conductive bonding material 83 to be capable of bonding and electrically connecting the collector electrodes CP of the semiconductor chips 4A, 4B, and 4C. The conductive bonding material 83 may be a silver paste, a copper paste, or solder. The conductive bonding material 83 corresponds to a second conductive bonding material of the present disclosure.

In the present embodiment, as shown in FIGS. 14 to 16, the semiconductor chip 4D is arranged on the first portion 11B of the lead 1B. The number of semiconductor chips mounted on the lead 1B is not particularly limited. In the illustrated example, as viewed in the z direction, the gate electrode GP of the semiconductor chip 4D is positioned closer to the plurality of leads 2 than the center of the semiconductor chip 4D in the y direction. In the illustrated example, the collector electrode CP of the semiconductor chip 4D is bonded to the first portion 11B with the conductive bonding material 83.

In the present embodiment, as shown in FIGS. 14 to 16, the semiconductor chip 4E is arranged on the first portion 11C of the lead 1C. The number of semiconductor chips mounted on the lead 1C is not particularly limited. In the illustrated example, as viewed in the z direction, the gate electrode GP of the semiconductor chip 4E is positioned closer to the plurality of leads 2 than the center of the semiconductor chip 4E in the y direction. In the illustrated example, the collector electrode CP of the semiconductor chip 4E is bonded to the first portion 11C with the conductive bonding material 83.

In the present embodiment, as shown in FIGS. 14 to 16, the semiconductor chip 4F is arranged on the first portion 11D of the lead 1D. The number of semiconductor chips mounted on the lead 1D is not particularly limited. In the illustrated example, as viewed in the z direction, the gate electrode GP of the semiconductor chip 4F is positioned closer to the plurality of leads 2 than the center of the semiconductor chip 4F in the y direction. In the illustrated example, the collector electrode CP of the semiconductor chip 4F is bonded to the first portion 11D with the conductive bonding material 83. As shown in FIG. 14, in the illustrated example, the semiconductor chips 4C and 4D overlap with the connecting portion 57 of the conductive portion 5, as viewed in the y direction. As shown in FIG. 15, the semiconductor chip 4D is positioned closer to the substrate 3 than the upper surface of the fourth portion 14B in the z direction.

<Diodes 41a-41f>

The diodes 41A, 41B, and 41C are mounted on the first portion 11A of the lead 1A. The diode 41D is mounted on the first portion 11B of the lead 1B. The diode 41E is mounted on the first portion 11C of the lead 1C. The diode 41F is mounted on the first portion 11D of the lead 1D.

<Control Chips 4G and 4H>

The control chips 4G and 4H are for controlling the drive of at least one of the semiconductor chips 4A to 4F. As shown in FIG. 14, the control chips 4G and 4H are electrically connected to at least one of the conductive portion 5 and the semiconductor chips 4A to 4F, and are arranged on the substrate 3. In the present embodiment, the control chip 4G controls the drive of the three semiconductor chips 4A, 4B, and 4C. The control chip 4H controls the drive of the three semiconductor chips 4D, 4E, and 4F. The shapes and sizes of the control chips 4G and 4H are not particularly limited. In the illustrated example, each of the control chips 4G and 4H has a long rectangular shape as viewed in the z direction, and is elongated in the x direction. The control chips 4G and 4H are chips for controlling the secondary power circuit of the present disclosure.

In the present embodiment, the control chip 4G is mounted on the first base member 55 of the conductive portion 5. The control chip 4H is arranged on the second base member 56 of the conductive portion 5. In the present embodiment, the control chip 4G is bonded to the first base member 55 with a conductive bonding material 84. The control chip 4H is bonded to the second base member 56 with the conductive bonding material 84.

It suffices for the conductive bonding material 84 to be capable of bonding the control chip 4G to the first base member 55, and of bonding and electrically connecting the control chip 4H to the second base member 56. The conductive bonding material 84 may be a silver paste, a copper paste, or solder. The conductive bonding material 84 corresponds to a third conductive bonding member of the present disclosure.

<Transmission Circuit Chip 4I>

The transmission circuit chip 4I includes a transmission circuit of the present disclosure. The transmission circuit chip 4I has a transformer configuration in which at least two coils are arranged opposite to and apart from each other, and transmits an electrical signal. In the present embodiment, the transmission circuit chip 4I may be mounted on the third base member 58 with the conductive bonding material 84, as shown in FIG. 15. The transmission circuit chip 4I is positioned between the control chip 4H and the primary circuit chip 4J as viewed in the x direction.

<Primary Circuit Chip 4J>

The primary circuit chip 4J transmits a command signal to the control chip 4H via the transmission circuit chip 4I. In the present embodiment, the primary circuit chip 4J may be mounted on the third base member 58 with the conductive bonding material 84, as shown in FIG. 15. The primary circuit chip 4J is positioned closer to the fifth surface 35 than the transmission circuit chip 4I in the y direction. The primary circuit chip 4J is an example of a chip including the primary control circuit of the present disclosure.

As shown in FIG. 15, the control chip 4H, the transmission circuit chip 4I, and the primary circuit chip 4J are arranged at positions lower and closer to the substrate 3 than the upper end of a fourth portion 241 in the z direction. Furthermore, the control chip 4H, the transmission circuit chip 4I, and the primary circuit chip 4J are arranged at positions lower and closer to the substrate 3 than the upper end of a first portion 211 in the z direction. The control chip 4G also has the positional relationship as described above.

<Diodes 49U, 49V, and 49W>

The diodes 49U, 49V, and 49W are electrically connected to the control chip 4G. In the present embodiment, the diodes 49U, 49V, and 49W can function as so-called boot diodes for applying a higher voltage to the control chip 4G. The diode 49U is bonded to the wiring portion 50B of the conductive portion 5 via a conductive bonding material. The conductive bonding material is the same material as the conductive bonding material 84 described above. The diode 49V is bonded to the wiring portion 50D of the conductive portion 5 with the conductive bonding material as described above. The diode 49W is bonded to the wiring portion 50F of the conductive portion 5 with the conductive bonding material 85 as described above.

<First Wires 91A to 91F>

Each of the first wires 91A to 91F is connected to any one of the semiconductor chips 4A to 4F and any one of the plurality of leads 1. The material of the first wires 91A to 91F is not particularly limited, and may be aluminum (Al) or copper (Cu). The diameter of each of the first wires 91A to 91F is not particularly limited, and may be approximately 250 to 500 μm. Each of the first wires 91A to 91F corresponds to a first conductive member of the present disclosure. Instead of the first wires 91A to 91F, it is possible to use leads made of Cu, for example.

The collector electrode CP of the semiconductor chip 4A and a cathode electrode of the diode 41A are connected to each other via the first portion 11A and the conductive bonding material 83. The collector electrode CP of the semiconductor chip 4B and a cathode electrode of the diode 41B are connected to each other via the first portion 11A and the conductive bonding material 83. The collector electrode CP of the semiconductor chip 4C and a cathode electrode of the diode 41C are connected to each other via the first portion 11A and the conductive bonding material 83.

<Second Wires 92>

As shown in FIG. 14, each of the plurality of second wires 92 is connected to either the control chip 4G or 4H. The material of the second wires 92 is not particularly limited. For example, the second wires 92 may be made of gold (Au). The diameter of each of the second wires 92 is not particularly limited. In the present embodiment, the diameter may be smaller than the diameter of each of the first wires 91A to 91F. The diameter of each of the second wires 92 is approximately 10 μm to 50 μm, for example. The second wires 92 each correspond to a second conductive member of the present disclosure. Hereinafter, the second wires 92 connected to the control chip 4G are referred to as second wires 92G, and the second wires 92 connected to the control chip 4H are referred to as second wires 92H.

<Third Wires 93>

As shown in FIG. 14, each of the plurality of third wires 93 is connected to either the control chip 4G or 4H. The material of the third wires 93 is not particularly limited. For example, the third wires 93 may be made of the same material as the second wires 92.

<Fourth Wires 94>

As shown in FIG. 14, the plurality of fourth wires 94 are connected to the transmission circuit chip 4I and the primary circuit chip 4J. The material of the fourth wires 94 is not particularly limited. For example, the fourth wires 94 may be made of the same material as the second wires 92.

<Fifth Wires 95>

As shown in FIG. 14, the plurality of fifth wires 95 are connected to the primary circuit chip 4J and the conductive portion 5. The material of the fifth wires 95 is not particularly limited. For example, the fifth wires 95 may be made of the same material as the second wires 92.

<Sixth Wires 96>

As shown in FIG. 14, the plurality of sixth wires 96 are connected to the control chip 4G and the conductive portion 5. The material of the sixth wires 96 is not particularly limited. For example, the sixth wires 96 may be made of the same material as the second wires 92.

<Seventh Wires 97>

As shown in FIG. 14, the plurality of seventh wires 97 are connected to the control chip 4H and the conductive portion 5. The material of the seventh wires 97 is not particularly limited. For example, the seventh wires 97 may be made of the same material as the second wires 92.

<Resin 7>

The resin 7 at least covers the semiconductor chips 4A to 4F, the control chips 4G and 4H, the transmission circuit chip 4I, primary circuit chip 4J, portions of the plurality of leads 1, and portions of the plurality of leads 2. In the present embodiment, the resin 7 covers the diodes 41A to 41F, the diodes 49U, 49V, and 49W, the plurality of first wires 91A to 91F, the plurality of second wires 92, the plurality of third wires 93, the plurality of fourth wires 94, the plurality of fifth wires 95, the plurality of sixth wires 96, and the plurality of seventh wires 97. The material of the resin 7 is not particularly limited. For example, an insulating material such as epoxy resin or silicone gel is suitably employed as the material of the resin 7.

In the present embodiment, the resin 7 has a first surface 71, a second surface 72, a third surface 73, a fourth surface 74, the fifth surface 75, the sixth surface 76, a recess 731, a recess 732, a recess 733, a hole 741, and a hole 742.

The first surface 71 intersects with the z direction. In the illustrated example, the first surface 71 is a plane perpendicular to the z direction. The first surface 71 faces the same side as the first surface 31 of the substrate 3. The second surface 72 intersects with the z direction. In the illustrated example, the second surface 72 is a plane perpendicular to the z direction. The second surface 72 faces opposite to the first surface 71, and faces the same side as the second surface 32 of the substrate 3.

The third surface 73 is positioned between the first surface 71 and the second surface 72 in the z direction. In the illustrated example, the third surface 73 is connected to the first surface 71 and the second surface 72. The third surface 73 intersects with the x direction, and faces the same side as the third surface 33 of the substrate 3. The fourth surface 74 is positioned between the first surface 71 and the second surface 72 in the z direction. In the illustrated example, the fourth surface 74 is connected to the first surface 71 and the second surface 72. The fourth surface 74 intersects with the x direction, faces opposite to the third surface 73, and faces the same side as the fourth surface 34 of the substrate 3.

The fifth surface 75 is positioned between the first surface 71 and the second surface 72 in the z direction. In the illustrated example, the fifth surface 75 is connected to the first surface 71 and the second surface 72. The fifth surface 75 intersects with the y direction, and faces the same side as the fifth surface 35 of the substrate 3. The sixth surface 76 is positioned between the first surface 71 and the second surface 72 in the z direction. In the illustrated example, the sixth surface 76 is connected to the first surface 71 and the second surface 72. The sixth surface 76 intersects with the x direction, faces opposite to the fifth surface 75, and faces the same side as the sixth surface 36.

The hole 741 passes through the resin 7 in the z direction. The hole 741 is not particularly limited in shape, but has a circular shape as viewed in the x direction in the illustrated example. The hole 741 is positioned between the third surface 33 of the substrate 3 and the third surface 73, as viewed in the z direction.

The hole 742 passes through the resin 7 in the z direction. The hole 742 is not particularly limited in shape, but has a circular shape as viewed in the x direction in the illustrated example. The hole 742 is positioned between the fourth surface 34 of the substrate 3 and the fourth surface 74, as viewed in the z direction.

As shown in FIGS. 11 and 14, the recess 731, the recess 732, and the recess 733 are recessed from the fifth surface 75 in the y direction. As viewed in the y direction, the recess 731 is positioned between the second portion 22B of the lead 2B and the second portion 22C of the lead 2C. As viewed in the y direction, the recess 732 is positioned between the second portion 22D of the lead 2D and the second portion 22E of the lead 2E. As viewed in the y direction, the recess 733 is positioned between the second portion 22F of the lead 2F and the second portion 22G of the lead 2G.

<Circuit Configuration of Semiconductor Device B1>

Next, descriptions will be provided of the circuit configuration of the semiconductor device B1.

FIG. 17 shows an example of a control circuit 600Y for driving a switching arm 40U of the semiconductor device B1. The semiconductor device B1 has control circuits for switching arms 40V and 40W as well, which are similar to the control circuit 600Y. The control circuit 600Y of the semiconductor device B1 is not limited to having the configuration shown in FIG. 17, and various changes can be made to the control circuit 600Y.

The level of voltage applied to a U terminal (lead 1B), a V terminal (lead 1C), and a W terminal (lead 1D) is approximately 0 V to 650 V, for example. On the other hand, the level of voltage applied to an NU terminal (lead 1E), an NV terminal (lead 1F), and an NW terminal (lead 1G) is approximately 0 V, for example, which is lower than the level of voltage applied to the terminal (lead 1B), the V terminal (lead 1C), and the W terminal (lead 1D). The semiconductor chips 4A to 4C constitute high-potential transistors of a three-phase inverter circuit, and the semiconductor chips 4D to 4F constitute low-potential transistors of the three-phase inverter circuit.

As shown in FIG. 17, the control circuit 600Y has a primary circuit 660, a secondary circuit 670, and a transformer 690. The control circuit 600Y uses the transformer 690 to insulate the primary circuit 660 from the secondary circuit 670, transmit a signal from the primary circuit 660 to the secondary circuit 670, and transmit a signal from the secondary circuit 670 to the primary circuit 660.

In the present embodiment, the primary circuit 660 is included in the primary circuit chip 4J. At least portions of the secondary circuit 670 is included in the control chips 4H and the control chip 4G. The transformer 690 is included in the transmission circuit chip 4I.

The primary circuit 660 includes a low-voltage malfunction preventing circuit 661, an oscillation (OSC) circuit 662, a signal transmission circuit 660U connected to an HINU terminal (lead 2I), and a signal transmission circuit 660L connected to an LINU terminal (lead 2L), and an abnormality protection circuit 660F connected to an FO terminal (lead 2P).

The signal transmission circuit 660U is a circuit for supplying a gate signal voltage to the gate electrode GP of the semiconductor chip 4A. The signal transmission circuit 660U includes, in order from the HINU terminal to the transformer 690, a resistor 663U, a Schmitt trigger 664U, a pulse generator 665U, and output buffers 667UA and 667UB. The resistor 663U pulls down the HINU terminal to a ground end. The Schmitt trigger 664U transmits an upper input signal HINU inputted to the HINU terminal to a level shifter. The output terminal of the Schmitt trigger 664U is connected to the pulse generator 665U. A first output terminal of the pulse generator 665U is connected to an output buffer 667UA, and a second output terminal of the pulse generator 665U is connected to an output buffer 667UB.

The signal transmission circuit 660L is a circuit for supplying a gate signal voltage to a gate of the semiconductor chip 4D. The signal transmission circuit 660L includes, in order from the LINU terminal to the transformer 690, a resistor 663L, a Schmitt trigger 664L, a pulse generator 665L, and output buffers 667LA and 667LB. The resistor 663L pulls down the LINU terminal to a ground end. The Schmitt trigger 664L transmits a lower input signal LINU inputted to the LINU terminal to a level shifter. An output terminal of the Schmitt trigger 664L is connected to the pulse generator 665L. A first output terminal of the pulse generator 665L is connected to an output buffer 667LA, and a second output terminal of the pulse generator 665L is connected to an output buffer 667LB.

The abnormality protection circuit 660F is a circuit for, when an abnormality has occurred in the semiconductor device B1, externally outputting information on the abnormality of the semiconductor device B1. The abnormality protection circuit 660F includes an RS flipflop circuit 666, input buffers 667FA and 667FB, a driver 668, and a transistor 669.

An output terminal of the input buffer 667FA is connected to an S terminal of the RS flipflop circuit 666, and an output terminal of the input buffer 667FB is connected to an R terminal of the RS flipflop circuit 666. A Q terminal of the RS flipflop circuit 666 is connected to the driver 668. An output terminal of the driver 668 is connected to a gate of the transistor 669. A source of the transistor 669 is grounded, and a drain of the transistor 669 is connected to an FO terminal.

The low-voltage malfunction preventing circuit 661 is a circuit for monitoring a supply voltage VCC of the primary circuit 660. The low-voltage malfunction preventing circuit 661 is connected to a set terminal (S terminal) of the RS flipflop circuit 666. When the supply voltage VCC of the primary circuit 660 falls below a predetermined threshold voltage, the low-voltage malfunction preventing circuit 661 switches a malfunction preventing signal from a logic level in a normal state (e.g., low level) to a logic level in an abnormal state (e.g., high level). An oscillation circuit 662 outputs a clock signal to each of the pulse generators 665U and 665L, the RS flipflop circuit 666, and the driver 668.

The secondary circuit 670 includes an oscillation circuit 671, a signal transmission circuit 670U, a signal transmission circuit 670L, and an abnormality protection circuit 670F. The signal transmission circuit 670U is a circuit for supplying a gate signal voltage of the signal transmission circuit 660U of the primary circuit 660 to a gate of the semiconductor chip 4A. The signal transmission circuit 670U includes, in order from the transformer 690 to the semiconductor chip 4A, input buffers 672UA and 672UB, an RS flipflop circuit 673U, a pulse generator 674U, a level shifter circuit 675U, an RS flipflop circuit 676, and a driver 677U. The signal transmission circuit 670U is also provided with the diode 49U and a current controller 49X that controls the current of the diode 49U. One example of the current controller 49X is a current limiting resistor.

An output terminal of the input buffer 672UA is connected to an S terminal of the RS flipflop circuit 673U, and an output terminal of the input buffer 672UB is connected to an R terminal of the RS flipflop circuit 673U. A Q terminal and QB terminal of the RS flipflop circuit 673U is connected to the pulse generator 674U. The pulse generator 674U is connected to the level shifter circuit 675U. The level shifter circuit 675U is configured such that a signal from the Q terminal of the RS flipflop circuit 673U is inputted to an S terminal of the RS flipflop circuit 673U, and that a signal from a QB terminal of the RS flipflop circuit 673U is inputted to an R terminal of the RS flipflop circuit 673U. A Q terminal of the RS flipflop circuit 676U is connected to the driver 677U. An output terminal of the driver 677U is connected to the gate of the semiconductor chip 4A. An R terminal of the RS flipflop circuit 676U is connected to a low-voltage malfunction preventing circuit 678. The pulse generator 674U generates pulse signals such as an ON signal and an OFF signal. The level shifter circuit 675U, disposed between a high potential block and a low potential block, shifts the level of a signal from the low potential block and transmits the signal to the high potential block. The driver 677U generates an upper output signal HOU, which is a signal corresponding to the output signal of the RS flipflop circuit 676U, and outputs the upper output signal HOU to the gate of the semiconductor chip 4A.

The signal transmission circuit 670L is a circuit for supplying a gate signal voltage of the signal transmission circuit 660L of the primary circuit 660 to the gate of the semiconductor chip 4D. The signal transmission circuit 670L includes, in order from the transformer 690 to the semiconductor chip 4D, input buffers 672LA and 672LB, an RS flipflop circuit 673L, and a driver 677L.

An output terminal of the input buffer 672LA is connected to an S terminal of the RS flipflop circuit 673L, and an output terminal of the input buffer 672LB is connected to an R terminal of the RS flipflop circuit 673L. A Q terminal and QB terminal of the RS flipflop circuit 673L is connected to the driver 677L. The driver 677L is connected to the gate of the semiconductor chip 4D.

The abnormality protection circuit 670F is a circuit for, when an abnormality has occurred in the semiconductor device B1, outputting information on the abnormality of the semiconductor device B1 to the primary circuit 660. The abnormality protection circuit 670F includes output buffers 672FA and 672FB, an abnormal signal generation circuit 679, a temperature protection circuit 680, a low-voltage malfunction preventing circuit 681, and a current limiting circuit 682. The abnormality protection circuit 670F is connected to a VCC terminal (lead 2Q) of the secondary circuit 670 and a CIN terminal (lead 2S, detection terminal CIN).

The abnormal signal generation circuit 679 is connected to the temperature protection circuit 680, the low-voltage malfunction preventing circuit 681, and the current limiting circuit 682. A first output terminal of the abnormal signal generation circuit 679 is connected to an output buffer 672FA, and a second output terminal is connected to an output buffer 672FB. The output buffer 672FA is connected to the R terminals of the RS flipflop circuits 673U and 673L.

The oscillation circuit 671 outputs a clock signal to each of the RS flipflop circuits 673U and 673L, and the abnormal signal generation circuit 679. The transformer 690 includes transformers 691 to 696. Each of the transformers 691 to 696 has a primary coil and a secondary coil.

A first terminal of the primary coil of the transformer 691 is connected to an output terminal of the output buffer 667UA, and a second terminal of the primary coil of the transformer 691 is grounded. A first terminal of the secondary coil of the transformer 691 is connected to the input buffer 672UA, and a second terminal of the secondary coil of the transformer 691 is grounded.

A first terminal of the primary coil of the transformer 692 is connected to an output terminal of the output buffer 667UB, and a second terminal of the primary coil of the transformer 692 is grounded. A first terminal of the secondary coil of the transformer 692 is connected to the input buffer 672UB, and a second terminal of the secondary coil of the transformer 692 is grounded.

A first terminal of the primary coil of the transformer 693 is connected to an output terminal of the output buffer 667LA, and a second terminal of the primary coil of the transformer 693 is grounded. A first terminal of the secondary coil of the transformer 693 is connected to the input buffer 672LA, and a second terminal of the secondary coil of the transformer 693 is grounded.

A first terminal of the primary coil of the transformer 694 is connected to an output terminal of the output buffer 667LB, and a second terminal of the primary coil of the transformer 694 is grounded. A first terminal of the secondary coil of the transformer 694 is connected to the input buffer 672LB, and a second terminal of the secondary coil of the transformer 694 is grounded.

A first terminal of the primary coil of the transformer 695 is connected to the input buffer 667FA, and a second terminal of the primary coil of the transformer 695 is grounded. A first terminal of the secondary coil of the transformer 695 is connected to an output terminal of the output buffer 672FA, and a second terminal of the secondary coil of the transformer 695 is grounded.

A first terminal of the primary coil of the transformer 696 is connected to the input buffer 667FB, and a second terminal of the primary coil of the transformer 696 is grounded. A first terminal of the secondary coil of the transformer 696 is connected to an output terminal of the output buffer 672FB, and a second terminal of the secondary coil of the transformer 696 is grounded.

In the present embodiment, the lead 2A may be referred to as a VSU terminal. The lead 2B may be referred to as a VBU terminal. The lead 2C may be referred to as a VSV terminal. The lead 2D may be referred to as a VBV terminal. The lead 2E may be referred to as a VSW terminal. The lead 2F may be referred to as a VBW terminal. The lead 2G may be referred to as a first GND terminal. The lead 2H may be referred to as a first VCC terminal. The lead 2I may be referred to as a HINU terminal. The lead 2J may be referred to as a HINV terminal. The lead 2K may be referred to as a HINW terminal. The lead 2L corresponds to an LINU terminal. The lead 2M may be referred to as an LINV terminal. The lead 2N may be referred to as an LINW terminal. The lead 2O is not used in the illustrated example. The lead 2P may be referred to as an FO terminal. The lead 2Q may be referred to as a third VCC terminal. The lead 2R may be referred to as a third GND terminal. The lead 2S corresponds to a CIN terminal. The lead 2T may be referred to as a second VCC terminal. The lead 2U may be referred to as a second GND terminal.

As shown in FIG. 4, the semiconductor device B1 overlaps with the back-surface wiring portion K221 and the back-surface wiring portion K222, as viewed in the z direction. The substrate 3 overlaps with the back-surface wiring portion K221 and the back-surface wiring portion K222, as viewed in the z direction.

The following describes the operation of the power converter A1.

According to the present embodiment, the semiconductor device B1 includes the transmission circuit chip 4I, whereby the primary control circuit and the secondary power circuit can be insulated from each other in the semiconductor device B1. On the other hand, the plurality of conductive paths D1 can connect the leads 2I, 2J, 2K, 2L, 2M, 2N and 2O, which are electrically connected to the control chip 4H including the primary control circuit of the semiconductor device B1, to the connecting terminal T1, which is connected to the microcontroller unit P1. Such arrangements can eliminate the need to provide e.g., a photocoupler element on the substrate H for sending a control signal to the primary control circuit in a manner such that the signal transmission function is ensured, while electrical conduction is prevented. As such, the power converter A1 can be downsized.

The conductive paths D1 extend along the y direction and are spaced apart from each other in the x direction. This makes it possible to reduce the dimension between the semiconductor device B1 and the connecting terminal T1 in the y direction, which is preferable in downsizing the power converter A1.

The capacitor C21 is connected to the front-surface wiring portion K11*g* in series. The front-surface wiring portion K11*g* is connected to the ground by the connecting terminal T2, and intersects with the back-surface wiring portions K211 to K216 that constitute the conductive paths D1 as viewed in the z direction. Such arrangement is also employed for the capacitors C22 to C26. This configuration can remove the noise of a control signal sent from the connecting terminal T1 to the primary control circuit and can save the space of the substrate H.

The leads 1B, 1C, and 1D, which are output terminals of the secondary power circuit, are connected to the connecting terminal T5 via the plurality of conductive paths D2. The dimension x171 of the front-surface wiring portion K171 that constitutes the conductive path D2 is larger than, for example, the dimension x111 of the front-surface wiring portion K111 that constitutes the conductive path D1. In this way, the conductive path D2 can allow a large current to flow, which is preferable in driving the motor M1 having a larger output. Furthermore, since the conductive path D2 includes the plurality of through portions K34, a larger current can flow the conductive path D2.

The semiconductor device B1 has the transformer 690 (transmission circuit chip 4I). Thus, if a secondary power circuit, such as a switching arm 40U, 40V, or 40W, breaks down for example, the transformer 690 (transmission circuit chip 4I) can prevent the damage from extending to the primary circuit 660 (primary circuit chip 4J). This makes it possible to protect devices such as microcomputers that are externally connected to the primary circuit 660 (primary circuit chip 4J) or the primary circuit 660 (primary circuit chip 4J).

As shown in FIG. 14, the transmission circuit chip 4I is arranged opposite to the semiconductor chips 4A to 4F with the control chip 4H therebetween in the y direction. The primary circuit chip 4J is arranged opposite to the control chip 4H with the transmission circuit chip 4I therebetween in the y direction. This allows the leads 2I to 2R, electrically connected to the primary circuit 660 (primary circuit chip 4J), to be separated sufficiently from electrically conductive portions connected to the control chip 4H or 4G in they direction.

The leads 2A to 2H and the leads 2S to 2U are electrically connected to the secondary circuit 670, and are arranged apart from each other on the opposite sides in the x direction with the leads 2I to 2R therebetween that are electrically connected to the primary circuit 660 (primary circuit chip 4J). This suppresses complication in the wiring paths of the conductive portion 5 in which the leads 2A to 2H and the leads 2S to 2U are electrically connected, as compared to the case where the leads 2A to 2H and the leads 2S to 2U are arranged on only one side in the x direction.

As shown in FIG. 11, the dimensions y21 of the protrusions of the second portions 221 to 22R from the fifth surface 75 are larger than the dimensions y22 of the protrusions of the second portions 22A to 22H and the second portions 22S to 22U from the fifth surface 75, as viewed in the z direction. In this way, when the semiconductor device B1 is mounted on a circuit board or the like, the leads 2I to 2R that are electrically connected to the primary circuit chip 4J can be insulated from the leads 2A to 2H that are electrically connected to the control chip 4G and from the leads 2S to 2U that are electrically connected to the control chip 4H.

As shown in FIG. 14, the control chip 4G and the semiconductor chip 4B overlap with each other as viewed in the y direction. This makes it possible to shorten the length of the second wires 92G connected to the semiconductor chip 4B and the control chip 4G, thus allowing for highly integrating the semiconductor device.

As shown in FIG. 14, the control chip 4H overlaps with the semiconductor chip 4E, the transmission circuit chip 4I, and the primary circuit chip 4J, as viewed in the y direction. This makes it possible to shorten the lengths of the wires connected to the semiconductor chip 4E, the transmission circuit chip 4I, and the primary circuit chip 4J, thus allowing for highly integrating the semiconductor device.

As shown in FIG. 14, the control chips 4G and 4H overlap with each other as viewed in the x direction. This makes it easier to arrange the semiconductor chips 4A to 4F and the plurality of leads 2 along the x direction, thus allowing for highly integrating the semiconductor device.

As shown in FIG. 14, the number of second wires 92H extending from the control chip 4H to the semiconductor chips 4D and 4E (toward the leads 1B and 1C) in the y direction is smaller than the number of third wires 93 extending from the control chip 4H to the transmission circuit chip 4I. If a temperature change occurs during the manufacture, use, etc., of the semiconductor device B1, thermal expansion occurs in the leads 1A to 1D and the substrate 3. The thermal expansion of the leads 1A to 1D that are made of metal is larger than the thermal expansion of the substrate 3 that is made of ceramic. In the present embodiment, the control chip 4H and the transmission circuit chip 4I are both arranged on the substrate 3. On the other hand, the semiconductor chips 4D and 4E are arranged on the leads 1B and 1C. Accordingly, when a temperature change occurs, variations in the positional relationship between the control chip 4H and the semiconductor chips 4D, 4E are larger than variations in the positional relationship between the control chip 4H and the transmission circuit chip 4I. The number of second wires 92H that are susceptible to stress from the resin 7 or other elements due to variations in the positional relationship is smaller than the number of third wires 93, whereby stress generated in the second wires 92H can be suppressed.

Also, as shown in FIG. 15, the second wires 92H are connected to the semiconductor chip 4D arranged on the first portion 11B of the lead 1B, to the semiconductor chip 4E arranged on the first portion 11C of the lead 1C, and to the control chip 4H. The third wires 93 are connected to the control chip 4H arranged on the substrate 3, and to the transmission circuit chip 4I. Accordingly, the third wires 93 are shorter than the second wires 92H. In other words, the second wires 92H are longer than the third wires 93. With such a configuration as the second wires 92H being longer than the third wires 93, even if variations in the positional relationship occurs due to the above-described temperature change, disconnection or the like of the second wires 92H that are more likely to be affected by variations in the positional relationship can be suppressed.

The power converter according to the present disclosure is not limited to the present embodiment described above. Various design changes can be made to the specific configurations of the elements of the power converter according to the present disclosure.

Clause 1.

A power converter comprising:

a semiconductor device that includes: a control chip constituting a primary control circuit; a semiconductor chip constituting a secondary power circuit; and a transmission circuit electrically insulating the primary control circuit and the secondary power circuit and having a signal transmission function between the primary control circuit and the secondary power circuit;

a first substrate with the semiconductor device mounted thereon, the first substrate formed with a first conductive portion;

a first connecting terminal disposed on the first substrate and electrically connected to the first conductive portion; and a first conductive path at least a portion of which is formed by the first conductive portion of the first substrate, the first conductive path electrically connecting the primary control circuit and the first connecting terminal.

Clause 2.

The power converter according to clause 1, wherein the first substrate includes a base member having a front surface and a back surface that face opposite to each other in a thickness direction, and the first conductive portion includes a front surface portion on the front surface, a back surface portion on the back surface, and a plurality of through portions each passing through the base member and electrically connecting a portion of the front surface portion and a portion of the back surface portion.

Clause 3.

The power converter according to clause 2, wherein the front surface portion includes a first front-surface wiring portion constituting the first conductive path, the back surface portion includes a first back-surface wiring portion constituting the first conductive path, and the plurality of through portions include a first through portion constituting the first conductive path.

Clause 4.

The power converter according to clause 3, further comprising a first resistor connected to the first front-surface wiring portion in series and constituting the first conductive path.

Clause 5.

The power converter according to clause 4, wherein the front surface portion includes a second front-surface wiring portion connected to the first front-surface wiring portion and to a ground.

Clause 6.

The power converter according to clause 5, further comprising a first capacitor connected to the second front-surface wiring portion in series.

Clause 7.

The power converter according to any of clauses 3 to 6, wherein the first connecting terminal is positioned apart from the semiconductor device in a first direction, and the first front-surface wiring portion extends along the first direction.

Clause 8.

The power converter according to any of clauses 3 to 7, wherein the first back-surface wiring portion extends along the first direction.

Clause 9.

The power converter according to any of clauses 3 to 8, further comprising a plurality of first conductive paths arranged apart in a second direction perpendicular to the first direction.

Clause 10.

The power converter according to clause 5 or 6, wherein the second front-surface wiring portion connects to and intersects with a plurality of first front-surface wiring portions.

Clause 11.

The power converter according to any of clauses 3 to 10, further comprising:

a second connecting terminal disposed on the first substrate and electrically connected to the first conductive portion; and a second conductive path at least apart of which is formed by the first conductive portion of the first substrate, the second conductive path electrically connecting the secondary power circuit and the second connecting terminal.

Clause 12.

The power converter according to clause 11,
wherein the front surface portion includes a third front-surface wiring portion constituting the second conductive path,
the back surface portion includes a second back-surface wiring portion constituting the second conductive path, and
the plurality of through portions include a second through portion constituting the second conductive path.

Clause 13.

The power converter according to clause 12, wherein a width of the third front-surface wiring portion in the second direction is larger than a width of the first front-surface wiring portion in the second direction.

Clause 14.

The power converter according to any of clauses 1 to 13, wherein the semiconductor device includes:
a second substrate;
a second conductive portion that is made of a conductive material formed on the second substrate;
a first lead arranged on the second substrate and having a higher heat dissipation than the second substrate;
the semiconductor chip being disposed on the first lead;
the control chip being electrically connected to the second conductive portion and the semiconductor chip, and disposed on the second substrate so as to be spaced apart from the semiconductor chip and the first lead in plan view, the control chip being configured to control the semiconductor chip;
a second lead spaced apart from the first lead and disposed on the second conductive portion so as to be electrically connected to the second conductive portion;
a transmission circuit chip that includes the transmission circuit, the transmission circuit chip being electrically connected to the second conductive portion and the second lead and disposed on the second substrate so as to be spaced apart from the semiconductor chip in plan view; and
a resin that covers the semiconductor chip, the control chip, and the transmission circuit chip, at least a portion of the second substrate, a portion of the first lead, and a portion of the second lead.

Clause 15.

The power converter according to clause 14, wherein the transmission circuit chip is configured as a transformer including at least two separate coils facing to each other for transmitting an electrical signal.

Clause 16.

The power converter according to clause 14 or 15, wherein the second substrate contains ceramic.

Clause 17.

The power converter according to any of clauses 14 to 16, wherein the second conductive portion contains silver.

The invention claimed is:

1. A semiconductor device comprising:
a substrate that is insulating and includes a main surface and a back surface;
a plurality of wiring patterns formed on the main surface or the back surface of the substrate;
a plurality of bonding portions being disposed on a surface of the substrate and a plurality of first leads being disposed on the plurality of bonding portions;
a semiconductor chip for switching operation respectively disposed on the plurality of first leads and electrically connected to respective ones of the plurality of first leads;
a control chip that controls an operation of the semiconductor chip, the control chip being electrically connected to the wiring patterns and the semiconductor chip and being located on the substrate so as to be spaced apart from the semiconductor chip and the plurality of first leads in plan view; and
an encapsulating resin covering the semiconductor chip, the control chip, at least a part of the substrate and a part of the plurality of first leads,
wherein a minimum separation between the plurality of wiring patterns is smaller than a minimum separation between the plurality of first leads.

2. The semiconductor device according to claim 1, wherein heights of the semiconductor chip and the control chip are different from each other when seen along a direction orthogonal to a thickness direction.

3. The semiconductor device according to claim 2, wherein a thickness of the wiring patterns is smaller than a sickness of the first leads.

4. The semiconductor device according to claim 1, wherein the first wire and the second wire are made from different materials.

5. The semiconductor device according to claim 1, wherein the substrate is made of at least one selected from the group consisting of alumina ($Al_2O_3$), silicon nitride (SiN), aluminum nitride (AlN), and zirconia-containing alumina.

6. The semiconductor device according to claim 1, wherein the semiconductor chip comprises low-voltage side switching elements and high-voltage side switching elements serially connected between a first power source and a second power source.

7. The semiconductor device according to claim 6, wherein the control chip includes a first integrated circuit element to control an operation of the high-voltage side switching elements, and a second integrated circuit element to control an operation of the low-voltage side switching elements.

8. The semiconductor device according to claim 1, wherein some control chip includes a transmission circuit chip that electrically insulates between an input signal and an output signal.

9. The semiconductor device according to claim 8, wherein the transmission circuit chip includes a transformer structure including at least two coils opposed to each other with a spacing therebetween.

10. The semiconductor device according to claim 7, further comprising a plurality of boot diodes electrically connected to the first integrated circuit element.

11. The semiconductor device according to claim 1, further comprising a plurality of second leads electrically connected to the semiconductor chip that is exposed, wherein a recess is formed on the encapsulating resin between second leads constituting at least a part of the plurality of second leads.

12. The semiconductor device according to claim 1, wherein among the plurality of first leads, an external first lead covered by the encapsulating resin includes a part that faces inwards.

13. The semiconductor device according to claim 1, wherein a minimal separation between conductive portions is shorter than a minimal separation between parts, to which the semiconductor chips are electrically connected, of the plurality of first leads.

14. The semiconductor device according to claim 11, wherein a minimal separation between terminals of the plurality of first leads is larger than a minimal separation between terminals of the plurality of second leads.

15. The semiconductor device according to claim 1, wherein the encapsulating resin has a recess between some of terminals exposed from the encapsulating resin.

16. A semiconductor device comprising:
- a substrate that is insulating and includes a main surface and a back surface;
- a plurality of wiring patterns made of a conductive material and formed on the main surface or the back surface of the substrate;
- a semiconductor chip for switching operation respectively disposed on the plurality of wiring patterns and electrically connected to respective ones of the plurality of wiring patterns;
- a driving chip for driving the semiconductor chip;
- a plurality of leads electrically connected to the semiconductor chip and the driving chip; and
- an encapsulating resin covering the semiconductor chip, the driving chip, at least a part of the substrate and a part of the plurality of leads, wherein a minimum separation between the plurality of wiring patterns is smaller than a minimum separation between the plurality of leads.

17. The semiconductor device according to claim 16, wherein heights of the semiconductor chip and the driving chip are different from each other when seen along a direction orthogonal to a thickness direction.

18. The semiconductor device according to claim 16, wherein the substrate is made of at least one selected from the group consisting of alumina ($Al_2O_3$), silicon nitride (SiN), aluminum nitride (AlN), and zirconia-containing alumina.

19. The semiconductor device according to claim 16, wherein the semiconductor chip comprises low-voltage side switching elements and high-voltage side switching elements serially connected between a first power source and a second power source.

20. The semiconductor device according to claim 16, wherein the encapsulating resin has a recess between some of terminals exposed from the encapsulating resin.

* * * * *